United States Patent
Kang et al.

(10) Patent No.: US 9,245,827 B2
(45) Date of Patent: Jan. 26, 2016

(54) 3D SEMICONDUCTOR DEVICE

(71) Applicant: Samsung Electronics Co., Ltd.

(72) Inventors: Uk-song Kang, Seongnam-si (KR); Dong-hyeon Jang, Yongin-si (KR); Seong-jin Jang, Seongnam-si (KR); Hoon Lee, Seongnam-si (KR); Jin-ho Kim, Uiwang-si (KR); Nam-seog Kim, Yongin-si (KR); Byung-sik Moon, Seoul (KR); Woo-dong Lee, Cheonan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 13 days.

(21) Appl. No.: 14/262,693

(22) Filed: Apr. 25, 2014

(65) Prior Publication Data

US 2014/0233292 A1 Aug. 21, 2014

Related U.S. Application Data

(62) Division of application No. 13/115,501, filed on May 25, 2011, now Pat. No. 8,743,582.

(30) Foreign Application Priority Data

May 25, 2010 (KR) ........................ 10-2010-0048616

(51) Int. Cl.
*G11C 5/06* (2006.01)
*H01L 23/48* (2006.01)
(Continued)

(52) U.S. Cl.
CPC ................ *H01L 23/481* (2013.01); *G11C 5/06* (2013.01); *G11C 8/18* (2013.01); *H01L 24/17* (2013.01);
(Continued)

(58) Field of Classification Search
CPC .................................... G11C 5/04; G11C 8/12
USPC ............................................... 365/63, 189.03
See application file for complete search history.

(56) References Cited

U.S. PATENT DOCUMENTS 6,418,067 B1 7/2002 Watanabe et al.
6,791,175 B2 9/2004 Matsuo et al.
(Continued)

FOREIGN PATENT DOCUMENTS

CN 1540665 A 10/2007
JP 2000-049277 2/2000
(Continued)

OTHER PUBLICATIONS

Office Action dated Dec. 24, 2014 in JP Patent Application No. JP 2011-117388.
(Continued)

*Primary Examiner* — Tuan T Nguyen
(74) *Attorney, Agent, or Firm* — Muir Patent Law, PLLC

(57) ABSTRACT

A three-dimensional (3D) semiconductor device may include a stack of chips, including a master chip and one or more slave chips. I/O connections of slave chips need not be connected to channels on a motherboard, and only electrode pads of a master chip may be connected to the channels. Only the master chip may provide a load to the channels. A through-substrate via (TSV) boundary may be set on a data input path, a data output path, an address/command path, and/or a clock path of a semiconductor device in which the same type of semiconductor chips are stacked.

21 Claims, 22 Drawing Sheets

(51) Int. Cl.
  *H01L 25/065* (2006.01)
  *H01L 25/00* (2006.01)
  *G11C 8/18* (2006.01)
  *H01L 21/66* (2006.01)
  *H01L 23/00* (2006.01)

(52) U.S. Cl.
  CPC ............ *H01L 25/0657* (2013.01); *H01L 25/50* (2013.01); *H01L 22/32* (2013.01); *H01L 24/05* (2013.01); *H01L 24/16* (2013.01); *H01L 24/73* (2013.01); *H01L 24/94* (2013.01); *H01L 2224/0401* (2013.01); *H01L 2224/05009* (2013.01); *H01L 2224/0557* (2013.01); *H01L 2224/05572* (2013.01); *H01L 2224/16145* (2013.01); *H01L 2224/16146* (2013.01); *H01L 2224/17051* (2013.01); *H01L 2224/17515* (2013.01); *H01L 2224/73204* (2013.01); *H01L 2224/94* (2013.01); *H01L 2225/06513* (2013.01); *H01L 2225/06544* (2013.01); *H01L 2225/06596* (2013.01); *H01L 2924/0002* (2013.01); *H01L 2924/00014* (2013.01); *H01L 2924/014* (2013.01); *H01L 2924/01006* (2013.01); *H01L 2924/01023* (2013.01); *H01L 2924/01033* (2013.01); *H01L 2924/01047* (2013.01); *H01L 2924/01055* (2013.01); *H01L 2924/10329* (2013.01); *H01L 2924/15311* (2013.01)

(56) References Cited

U.S. PATENT DOCUMENTS

| | | | |
|---|---|---|---|
| 6,991,964 B2 | 1/2006 | Matsuo et al. |
| 7,054,202 B2 | 5/2006 | Lee et al. |
| 7,123,497 B2 | 10/2006 | Matsui et al. |
| 7,327,590 B2 | 2/2008 | Matsui et al. |
| 7,535,772 B1 | 5/2009 | Parameswaran et al. |
| 7,548,444 B2 | 6/2009 | Matsui et al. |
| 7,564,127 B2 | 7/2009 | Ikeda et al. |
| 7,965,531 B2 | 6/2011 | Matsui et al. |
| 8,238,134 B2 | 8/2012 | Matsui et al. |
| 8,854,854 B2 | 10/2014 | Matsui et al. |
| 2004/0120176 A1 | 6/2004 | So et al. |
| 2004/0246783 A1 | 12/2004 | Lee et al. |
| 2009/0039492 A1 | 2/2009 | Kang et al. |
| 2009/0039915 A1 | 2/2009 | Ruckerbauer et al. |
| 2009/0040861 A1 | 2/2009 | Ruckerbauer |
| 2009/0103345 A1 | 4/2009 | McLaren et al. |
| 2010/0020583 A1 | 1/2010 | Kang et al. |
| 2011/0026293 A1* | 2/2011 | Riho .................... G11C 5/02 365/63 |
| 2014/0347943 A1* | 11/2014 | Kim .................... G11C 29/006 365/200 |

FOREIGN PATENT DOCUMENTS

| | | |
|---|---|---|
| JP | 2003-110086 | 4/2003 |
| JP | 2005-122823 | 5/2005 |
| JP | 2005-210106 | 8/2005 |
| JP | 2006-301863 | 11/2006 |
| JP | 2006-330974 | 12/2006 |
| JP | 2008-235838 | 10/2008 |
| JP | 2008-300469 | 12/2008 |
| KR | 2004-0091580 A | 10/2004 |
| KR | 10-0843240 | 6/2008 |
| KR | 2009-0007852 A | 1/2009 |
| KR | 2009-0034570 A | 4/2009 |
| KR | 2009-0000490 A | 7/2009 |

OTHER PUBLICATIONS

Office Action dated Sep. 26, 2014 for CN Application No. CN201110219876.1.

* cited by examiner

3D SEMICONDUCTOR DEVICE

CROSS-REFERENCE TO RELATED APPLICATIONS

This application claims the benefit of priority to and is a divisional application of U.S. application Ser. No. 13/115,501 filed on May 25, 2011, which claims the benefit of priority under 35 U.S.C. §119 of Korean Patent Application No. 10-2010-0048616, filed on May 25, 2010, in the Korean Intellectual Property Office, the disclosure of each of which is incorporated herein in its entirety by reference.

BACKGROUND

The inventive concept relates to a semiconductor device, and more particularly, to a three-dimensional (3D) semiconductor device including through-substrate vias (TSVs).

As digital information device products, such as mobile phones, digital cameras, personal digital assistants (PDAs), and the like, become smaller and lighter, with improved functionality and higher performance, semiconductor packages used within these devices are desired to be small, light and have high integration densities. 3D semiconductor technology for providing a plurality of semiconductor chips within one package has drawn attention.

SUMMARY

A semiconductor device including an arrangement boundary of through-substrate vias (TSVs) and having a load-decoupled architecture is disclosed herein.

A semiconductor device in which the same type of semiconductor chips are stacked and may be configured differently is also disclosed.

A semiconductor device in which semiconductor chips having the same original circuit design are stacked is also disclosed.

A semiconductor device in which a wafer can be tested after a chip identification fuse is cut is also disclosed.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
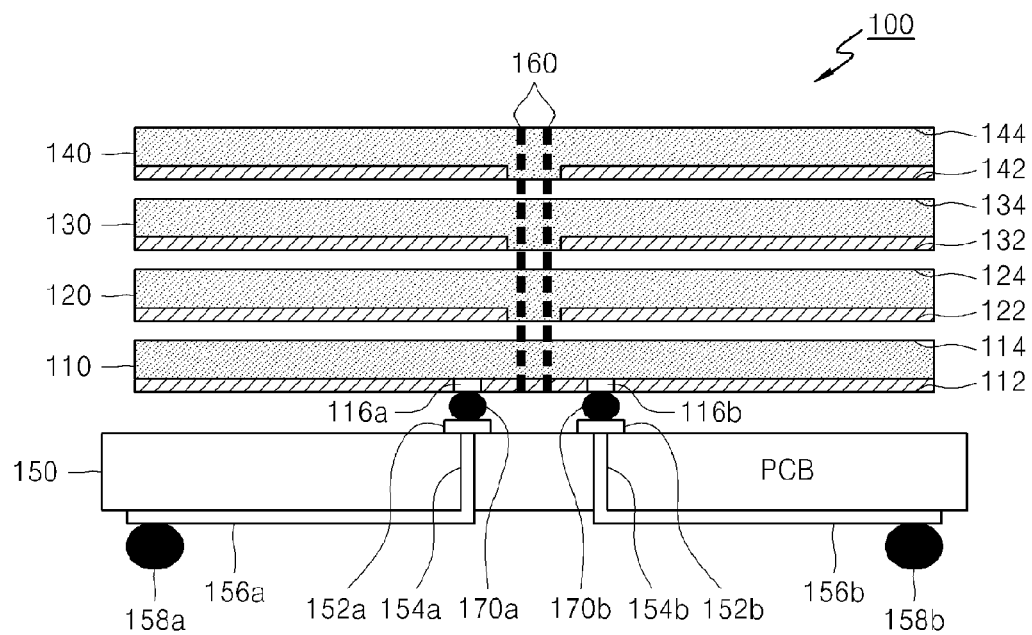
FIG. 1 illustrates a three-dimensional (3D) semiconductor device according to an embodiment.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions may be exaggerated for clarity. Also, various elements and regions in the drawings are schematically marked. Thus, the inventive concept is not limited to relative sizes or distances drawn in the accompanying drawings. Like reference numerals in the drawings denote like elements, and thus their description will not be repeated.

It will be understood that when an element or layer is referred to as being "on," "connected to," "coupled to," or "adjacent to" another element or layer, it can be directly on, connected, coupled, or adjacent to the other element or layer or intervening elements or layers may be present. In contrast, when an element is referred to as being "directly on," "directly connected to," "directly coupled to," "directly adjacent to," another element or layer, or the like, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an edge or corner region illustrated as having sharp edges may have somewhat rounded or curved features. Likewise, elements illustrated as circular or spherical may be oval in shape or may have certain straight or flattened portions. Thus, the regions illustrated in the figures may be schematic in nature and their shapes are not intended to limit the scope of the disclosed embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a three-dimensional (3D) semiconductor device 100 according to one embodiment. In this example, the three dimensional (3D) semiconductor device 100 comprises a stack of a plurality of chips 110, 120, 130, and 140, arranged in one package, the plurality of chips 110, 120, 130 and 140 being in communication via through-substrate via (TSV) connections 160. The plurality of chips 110, 120, 130, and 140 are stacked on a substrate 150. The substrate 150 may be, for example, a printed circuit board (PCB) (e.g., polyimide, FR4, etc.) or another type of substrate. Each TSV connection comprises a through-substrate via in each of the plurality of chips 110, 120, 130 and 140, connected to form a single node, each through-substrate via comprising a via penetrating through at least the substrate of chip and may (as shown) penetrate through the entire chip. When the through-substrate via penetrates through the substrate but not through the entire chip, the chip may also include wiring connecting the through substrate via to a chip pad or terminal to the top surface of the chip. The through-substrate vias may be through silicon vias when the substrate is silicon (e.g., formed from a crystalline silicon wafer on and/or in which internal circuitry is formed by semiconductor processing). The through-substrate vias may also be formed through other substrates used in semiconductor chip manufacturing, such as silicon-on-insulator, germanium, silicon-germanium, gallium-arsenic (GaAs) and the like. Two TSV connections 160 are shown in FIG. 1 for simplicity. The TSV connections 160 may include one or more of a data through electrode, an address through electrode, a command through electrode, a power supply through electrode, a ground through electrode, and the like.

The first through fourth chips 110, 120, 130, and 140 each include first surfaces 112, 122, 132, 142 that are respectively top surfaces of the first through fourth chips 110, 120, 130, and 140, and second surfaces 114, 124, 134, and 144 that are respectively bottom surfaces of the first through fourth chips 110, 120, 130, and 140. In FIG. 1, the top surfaces of the chips are below that of the corresponding bottom surface of their chip as the chips are stacked in a face down configuration. Circuit patterns 111 (not shown) of the first through fourth chips 110, 120, 130, and 140 may be disposed on the first surfaces 112, 122, 132, and 142. The second surfaces 114, 124, 134, and 144 are wafer backsides of the first through fourth chips 110, 120, 130, and 140.

In this example, first chip 110 is stacked directly on the substrate 150 and operates as a master chip. The second through fourth chips 120, 130, and 140 stacked on the master chip 110 and operate as first through third slave chips. The master chip 110 and the first through third slave chips 120, 130, and 140 may be the same type or different types chips. For example, the master chip 110 and slave chips 120, 130 and 140 may be made with the same mask designs, and/or with the same process recipes, e.g., such as the same process recipes through wafer preparation to depositing the passivation layer. Thus, the circuit designs may be the same. Alternatively, different circuit designs may be used for the master chip 110 and slave chips 120, 130 and 140.

The master chip 110 and the first through third slave chips 120, 130, and 140 are connected to one another via the TSV connections 160. Electrode pads 116a and 116b formed on the first surface 112 of the master chip 110 are connected to the circuit patterns 111 of the master chip 110 and are connected to terminals or electrodes 152a and 152b formed on the substrate 150 via bumps 170a and 170b. The electrodes 152a and 152b formed on the substrate 150 are connected to substrate wirings 156a and 156b and solder bumps 158a and 158b by vias 154a and 154b. The solder bumps 158a and 158b may be connected to wiring on a system printed circuit board forming a channel, such as a memory module circuit board, to connect the 3D semiconductor device 100 with external devices (not shown).

The external connections of the first through third slave chips 120, 130, and 140 do not connect to the channels but only to the electrode pads 116a and 116b formed on the master chip 110. Thus, only the master chip 110 has a channel load and a device communicating with the 3D semiconductor device 100 sees only the channel load of the master chip 110 rather than a channel load of all four chips 110, 120, 130 and 140. Compared to the case where chips are simply stacked in a packaging manner, such as a double die package (DDP) or a quad die package (QDP), the first through third slave chips 120, 130, and 140 are load-decoupled to the channels so that a data input/output speed may be improved.

When the master chip 110 and the first through third slave chips 120, 130, and 140 are same type chips, circuit blocks shared with the master chip 110, such as a delay synchronization circuit block, a data input/output circuit block, a clock circuit block, and the like, from among circuit blocks of the first through third slave chips 120, 130, and 140, may not be used and thus may be in an off state. When the master chip 110 and the first through third slave chips 120, 130, and 140 are different types of chips, the circuit blocks shared with the master chip 110 may not be designed and replicated in the first through third slave chips 120, 130, and 140. Compared to the case where chips are simply stacked in a conventional packaging manner, such as a DDP or QDP, power consumption of the first through third slave chips 120, 130, and 140 may be reduced. Also, when the master chip 110 and the first through third slave chips 120, 130, and 140 are different types of chips, since circuit blocks of the master chip 110 may not be implemented and replicated in the first through third slave chips 120, 130, and 140, the sizes of the first through third slave chips 120, 130, and 140 may be less than that of the master chip 110.

Options for setting positions of TSVs (hereinafter, referred to as "an options for setting a TSV boundary") by which load-decoupling effects of the first through third slave chips 120, 130, and 140 may be implemented when the master chip 110 and the first through third slave chips 120, 130, and 140 are same type chips, will be described with reference to FIGS. 2 through 6 in detail. The semiconductor memory device 200 that will be described in FIG. 2 may be equivalent to the master chip 110 and the first through third slave chips 120, 130, and 140.

Figure 2:
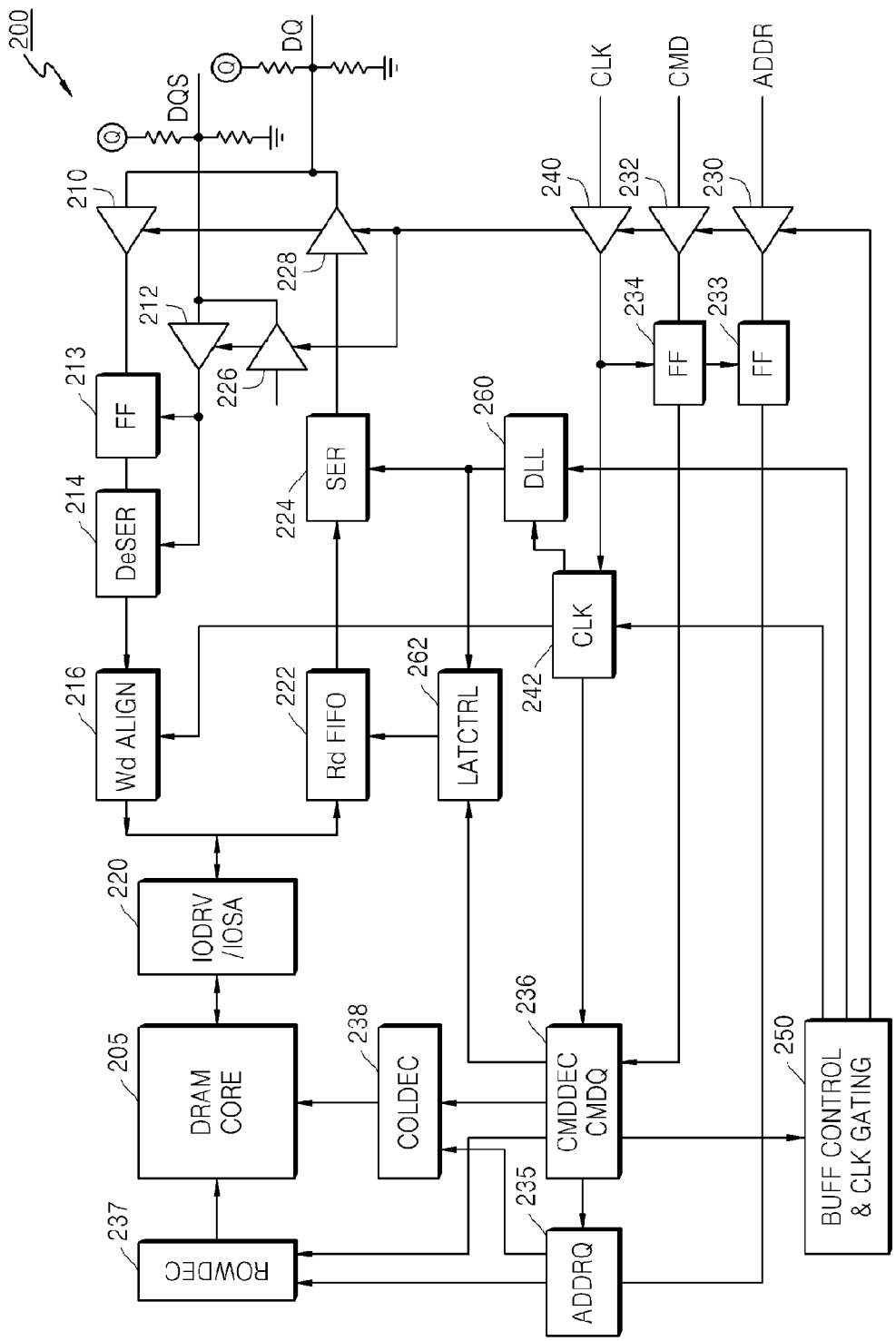
FIG. 2 is a block diagram of a semiconductor memory device according to an embodiment.

FIG. 2 is a block diagram of an exemplary semiconductor memory device 200. Referring to FIG. 2, the semiconductor memory device 200 may be a dynamic random access memory (DRAM) chip, for example. The semiconductor memory device 200 includes a memory cell array block DRAM CORE 205 in which a plurality of memory cells are arranged, a row decoder ROWDEC 237 and a column decoder COLDEC 238 that address the plurality of memory cells, and a data input/output driver/sense amplifier IODRV/IOSA 220 that writes data in and reads data from the memory cell array block DRAM CORE 205. Furthermore, the semiconductor memory device 200 further includes a data input/output pad DQ, a data strobe pad DQS, a clock pad CLK, a command pad CMD, and an address pad ADDR. The pads DQ, DQS, CLK, CMD, and ADDR each are connected to buffers 210, 212, 226, 228, 230, 232, and 240.

Buffers 230, 232, 240 are input buffers connected to receive address, command and clock signals input from a source external to chip 200. In this example, buffers 230, 232 and 240 are directly connected to address chip pad(s) (ADDR), command chip pad(s) (CMD) and clock chip pad(s) CLK.

Buffers 210 and 228 constitute a data input/output buffer connected to respectively receive and output data from/to a source external to chip 200. In this example, buffers 210 and 228 are directly connected to DQ chip pad(s). Buffer 212 is connected to receive a data strobe signal from a source external to the chip 200, and buffer 226 is connected to output a data strobe signal to a source external to the chip 200.

Each of the buffers 210, 212, 226, 228, 230, 232, and 240 may include one or more of a plurality of buffer circuit parts to respectively receive or send its own signal (each buffer circuit part may be a buffer with respect to its own individual signal). For example, address buffer 230 may comprise eighteen buffer circuit parts, each buffering a respective address signal A0-A17 provided on a respective address chip pad. Whether each of the buffers 210, 212, 226, 228, 230, 232, and 240 includes multiple buffer circuit parts connected to multiple chip pads depends on design considerations of the chip 200 and the invention should not be considered to be limited to any particular buffer implementations unless otherwise specified. Similarly, flip flops FF 213, 234 and 233 may include plural flip flops corresponding in number to the number of buffer circuit parts to which the respective flip flop 213, 234 or 233 is connected. Buffers 210, 212, 226, 228, 230, 232, and 240 may be designed to communicate with external sources via differential signaling, in which case, each buffer circuit part may connect to two chip pads and act to convert single ended signaling to differential signaling (if configured to output external signals), or to convert differential signaling to single ended signaling (if configured to input external signals).

Data buffer 210 may include n buffer circuit parts, each connected to a respective one of n data I/O pads DQ. A plurality of pieces of n-bit data sequentially input to the data input/output pads DQ are transferred to the data input buffer 210 and latched by a flip flop FF 213 and output sequentially to deserializer DeSER 214. Deserializer DeSER 214 sequentially receives m pieces of n-bit data and outputs the m pieces of n-bit data as m×n bit parallel data. The deserializer may be implemented by n serial to parallel converters which operate on m sequentially input bits received from a respective one of the n data I/O pads DQ via buffer 210. The m×n bit parallel data is transferred to the data input/output driver/sense amplifier IODRV/IOSA 220 via a write data alignment circuit Wd ALIGN 216 that may adjust the position of the m pieces of parallel n-bit parallel data with respect to a row of the memory cell array block DRAM CORE 205. For example, the Wd ALIGN 216 may rearrange the m pieces of n bit parallel data on a local I/O bus connected to receive data from DRAM core 205. A plurality of pieces of n-bit data may be read from the DRAM core 205. For example, parallel read data output from the memory cell array block DRAM CORE 205 may comprise m pieces of n-bit data. This m×n parallel data may be amplified by the data input/output driver/sense amplifier IODRV/IOSA 220. Relative positions of the m pieces of n-bit data may be adjusted by a read data alignment circuit 222 (hereinafter, referred to as a read first-in/first-out (FIFO)). Serializer SER 224 may convert the parallel m×n bit data into m sequential pieces of n-bit data. Serializer SER 224 may comprise n parallel to serial converters each of which operate on m bits of the m×n parallel data. The m sequential pieces of n-bit data are sequentially output to the data output buffer 228 by the serializer SER 224 and thus onto the n data I/O chip pads DQ. As one example, the number of I/O data pads DQ may be 16 (n=16) and an internal data bus width may be 128

(m=8). As another example, the number of data I/O chip pads may be 4 (n=4) and an internal data bus width may be 16 or 32 (m=4 or 8). The number of data I/O chip pads may be larger than 16, such as 32 or more (n=32, or n is greater than 32). Exemplary details of a data I/O path structure that may be implemented with this invention may be found in U.S. Pat. Nos. 6,930,939 and 7,855,926 which are hereby incorporated by reference in their entirety.

A data strobe signal input to the data strobe pad DQS is generated as an input data strobe signal after passing through the data input buffer 212 and is used to control the flip flop FF 213 and the deserializer 214. An output data strobe signal generated by an operation of an internal circuit of the semiconductor memory device 200 is output to the data strobe pad DQS via the output buffer 226.

An address signal input to the address pad ADDR is transferred to an address buffer ADDRQ 235 via the data input buffer 230 and a flip flop FF 233. A command signal input to the command pad CMD is transferred to a command buffer and command decoder CMDDEC CMDQ 236 via the data input buffer 232 and a flip flop FF 234. The address signal transferred to the address buffer ADDRQ 235 and the command signal transferred to the command buffer and command decoder CMDDEC CMDQ 236 are transferred to the row decoder ROWDEC 237 and the column decoder COLDEC 238 and are used to activate a wordline and a bitline for selecting a memory cell. Furthermore, command control signals generated in the command buffer and command decoder CMDDEC CMDQ 236 are transferred to a buffer control and clock gating circuit BUFF CONTROL & CLK GATING 250 and are used to generate buffer control signals and clock gating signals.

A clock signal input to the clock pad CLK is transferred to a clock generator and buffer circuit CLK 242 via the data input buffer 240 and is generated as a plurality of internal clock signals. The plurality of internal clock signals generated in the clock generator and buffer circuit CLK 242 are used to control the command buffer and command decoder CMDDEC CMDQ 236 and the write data alignment circuit Wd ALIGN 216. Also, the internal clock signals are supplied to the delay synchronization circuit DLL 260 and are used to control the serializer SER 224 and a latency controller 262. The latency controller 262 controls the read FIFO Rd FIFO 222 in response to the command signal generated in the command buffer and command decoder CMDDEC CMDQ 236. The buffer control signals and the clock gating signals generated in the buffer control and clock gating circuit BUFF CONTROL & CLK GATING 250 are used to control the clock generator and buffer circuit CLK 242, the delay synchronization circuit DLL 260, and the data input/output buffers 210, 212, 226, 228, 230, 232, and 240.

Although data chip pads DQ, command chip pads CMD and address chip pads ADDR are described as separate and distinct from one another in the above example, such data, address and/or command signals may be received on shared chip pads and multiplexed to be latched separately (e.g., such as by flip-flop circuits 233, 234 and 213).

TSV boundaries in the 3D semiconductor device may be performed on one or more signal paths, such as a data input path, a data output path, a command/address path, a clock path, a latency/DLL path, or the like. The following description is made in connection with a 3D semiconductor device 100 regarding a master chip 110 and slave chips 120, 130 and 140 that may be the same as the semiconductor memory device 200. However, the invention and description can be applicable to stacks of semiconductor chips where the master and slave chips are the same but have a different design than that of semiconductor memory device 200, or where the master chip differs from the slave chips, and/or where some or all of the slave chip designs differ from each other, and the master chip is different from all or only some of the slave chips.

Figure 3:
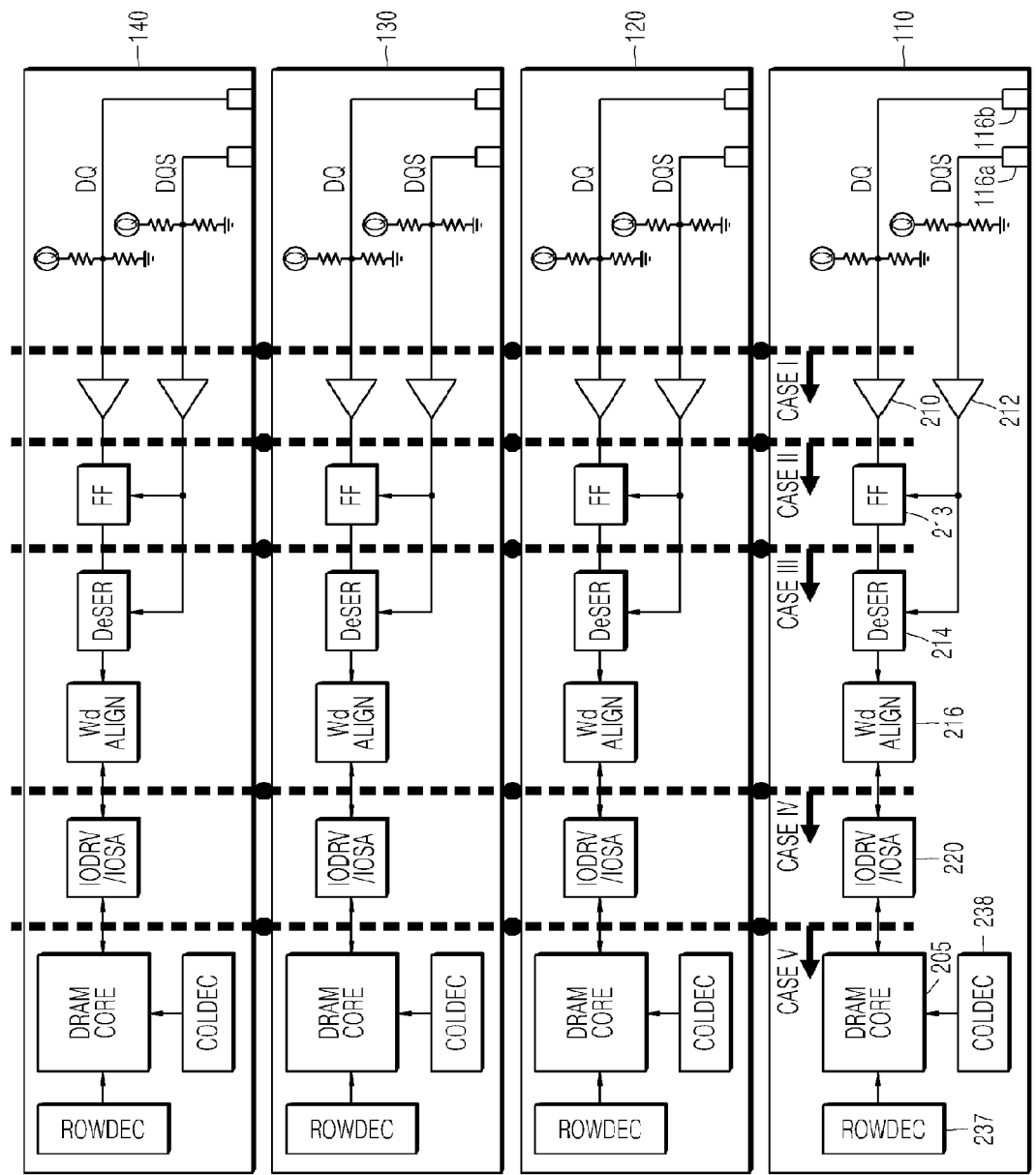
FIG. 3 illustrates an operation of setting a through-substrate via (TSV) boundary on a data input path of the 3D semiconductor device illustrated in FIG. 1.

FIG. 3 is a block diagram illustrating several options for through-substrate via (TSV) connection boundaries on a data input path of the 3D semiconductor device 100 illustrated in FIG. 1. The data input path for each of chips 110, 120, 130 and 140 includes a data input/output pad DQ, a data strobe pad DQS, a data input buffer 210, a data strobe input buffer 212, a deserializer DeSER 214, a write data alignment circuit Wd ALIGN 216, a data input/output driver/sense amplifier IODRV/IOSA 220, and a memory cell array block DRAM CORE 205.

On the data input path, the position of the TSV connections 160 may be set at several boundary options. FIG. 3 illustrates five options (Cases I-V) for TSV positions. It should be noted that one option (one of Case I-V) is sufficient to implement TSV connections to a data input path of a slave chip from a master chip. While the various options illustrated in FIG. 3 may not be mutually exclusive, a single option may be implemented in a particular 3D semiconductor device and the other remaining options need not be implemented. However, all options are illustrated with respect to a single FIGURE for ease of explanation.

Case I represents a TSV connection through each data input/output pad DQ and a TSV connection through the data strobe pad DQS. TSV connections of Case I may alternatively be implemented anywhere on the signal path between the data input/output pad DQ and buffer 210 (e.g., a wiring connected to the data input/output pad DQ), and similarly, between the signal path between chip pad DQS and buffer 212. Thus, if the design of chips 110, 120, 130 and 140 provided sixteen DQ I/O pads DQ0-DQ15 and one DQS chip pad, Case I represents a TSV connection through DQ0 of chip 110, 120, 130 and 140, a TSV connection through DQ1 of these chips, and respective TSV connections for each of the DQn input/output chip pad groups of these chips. Case I may also include a TSV connection through each of the DQS chip pads of each of chips 110, 120, 130 and 140.

Case II represents TSV connections 160 respectively connecting corresponding ones of the data signal paths of each chip located between a corresponding data input buffer 210 and flip flop FF 213 (for the data signals) and a TSV connection connecting to an output of the data strobe input buffer 212 of each chip. Case III represents TSV connections 160 respectively connecting corresponding ones of the data signal paths of each chip located between an output of a corresponding flip flop FF 213 and before a deserializer DeSER 214 and/or write data alignment circuit Wd ALIGN 216. Case IV represents TSV connections 160 respectively connecting corresponding ones of the data signal paths of each chip located between an output of a deserializer DeSER 214 and/or write data alignment circuit Wd ALIGN 216 and the data input/output driver/sense amplifier IODRV/IOSA 220. It is contemplated that this invention may be applied to chip designs without a deserializer DeSER 214 and the write data alignment circuit Wd ALIGN 216. In such a case, Case III and Case IV may represent the same TSV connections 16. Case V represents TSV connections 160 respectively connecting corresponding ones of the data signal paths of each chip located between the data input/output driver/sense amplifier IODRV/IOSA 220 and the memory array (including the DRAM 205).

When the master chip 110 and the first through third slave chips 120, 130, and 140 are stacked and the TSV connections 160 are positioned as Case I, Case II, Case III, Case IV, and Case V, certain circuitry of the first through third slave chips 120, 130, and 140 may not be used. For example, when the position of the TSV 160 is set after the data input/output pads (an alternative Case I implementation), the data input/output pads DQ and the data strobe pads DQS of the first through third slave chips 120, 130, and 140 are not used (or need not be used). The data input/output pads DQ and the data strobe pad DQS of the master chip 110 are shared by the first through third slave chips 120, 130, and 140 and the first through third slave chips 120, 130 and 140 may receive data through the data input/output pads DQ of the master chip 110 and the corresponding TSV connections 160. The data input/output pads DQ and the data strobe pad DQS of the master chip 110 are connected to the electrode pads 116a and 116b of the 3D semiconductor device 100 (see FIG. 1).

When the position of the TSV connections 160 are set as the second boundary Case II, the data input/output pads DQ, the data strobe pads DQS, the data input buffers 210, and the data strobe input buffers 212 of the first through third slave chips 120, 130, and 140 need not be used. The data input/output pads DQ, the data strobe pad DQS, the data input buffer 210, and the data strobe input buffer 212 of the master chip 110 are shared by the first through third slave chips 120, 130, and 140.

When the position of the TSV connections 160 are set as the third boundary Case III, the data input/output pads DQ, the data strobe pads DQS, the data input buffers 210, the data strobe input buffers 212, and the flip flops FF 213 of the first through third slave chips 120, 130, and 140 need not be used. The data input/output pads DQ, the data strobe pad DQS, the data input buffer 210, the data strobe input buffer 212, and the flip flop FF 213 of the master chip 110 are shared by the first through third slave chips 120, 130, and 140.

When the position of the TSV connections 160 are set as the fourth boundary Case IV, the data input/output pads DQ, the data strobe pads DOS, the data input buffers 210, the data strobe input buffers 212, the flip flops FF 213, the deserializers 214, and the write data alignment circuits Wd ALIGN 216 of the first through third slave chips 120, 130, and 140 need not be used. The data input/output pads DQ, the data strobe pad DQS, the data input buffer 210, the data strobe input buffer 212, the flip flop FF 213, the deserializer 214, and the write data alignment circuit Wd ALIGN 216 of the master chip 110 are shared by the first through third slave chips 120, 130, and 140.

When the position of the TSV connections 160 are set as the fifth boundary Case V, the data input/output pads DQ, the data strobe pads DQS, the data input buffers 210, the data strobe input buffers 212, the flip flops FF 213, the deserializers 214, the write data alignment circuits Wd ALIGN 216, and the data input/output driver/sense amplifiers IODRV/IOSA 220 of the first through third slave chips 120, 130, and 140 need not be used. The data input/output pads DQ, the data strobe pad DQS, the data input buffer 210, the data strobe input buffer 212, the flip flop FF 213, the deserializer 214, the write data alignment circuit Wd ALIGN 216, and the data input/output driver/sense amplifier IODRV/IOSA 220 of the master chip 110 are shared by the first through third slave chips 120, 130, and 140. For each of Cases I, II, III, IV and V, a portion of a data input path of the slave chip from a chip pad to a location of the data input path internal to the slave chip may not be used. For example, when the 3D semiconductor device is packaged in a semiconductor package (e.g., encased in a protective molding material), the data chip pads DQ may not have any external conductor connection and no signal connection for inputting a data signal. Cases I, II, III, IV and V, a portion of a data output path from an internal location of the data output path to a chip pad DQ may not be used. For example, when the 3D semiconductor device is packaged in a semiconductor package (e.g., encased in a protective molding material), the data chip pads DQ may not have any external conductor connection and ability to transmit data signals external to the package.

Table 1 shows characteristics of comparative examples for a 3D semiconductor device 100 using devices 200 as a master chip 110 and as slave chips 120, 130 and 140 when implementing Case I, II, III, IV, and V TSV connections 160 on the data input path of chips 110, 120, 130 and 140 having four data I/O chip pads DQ.

TABLE 1

|  | Case I | Case II | Case III | Case IV | Case V |
|---|---|---|---|---|---|
| Data window (slave) | 0.5 * tCK | 0.5 * tCK | 0.5 * tCK | 4 * tCK | 4 * tCK |
| Number of TSVs | 4 | 4 | 4 | 16 or 32 | 1000 or more available according to structure |
| Load-decoupling effects | X | ○ | ○ | ○ | ○ |
| tDS/DH | poor | poor | good | good | good |

As shown in Table 1, as the position of the TSV 160 is closer to the fifth boundary Case V from the first boundary Case I, a data window becomes wider for the slave chips, a data setup/hold time tDS/DH improves, and load-decoupling effects are provided. However, as the position of the TSV connections 160 moves closer to the fifth boundary Case V from the first boundary Case I, the number of TSVs 160 increases.

Figure 4:
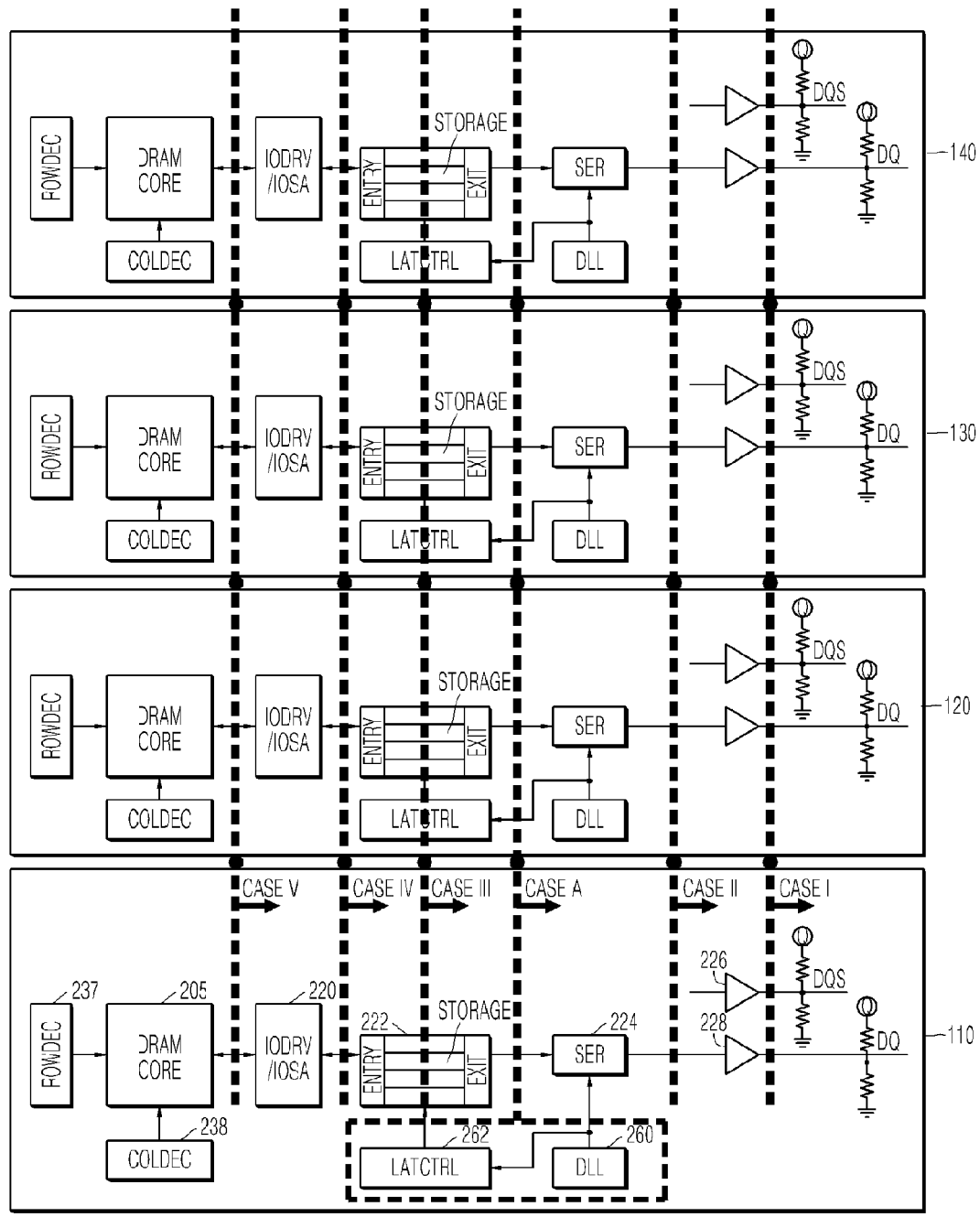
FIG. 4 illustrates an options for setting a TSV boundary on a data output path of the 3D semiconductor device illustrated in FIG. 1.

FIG. 4 illustrates five options (Cases I-V) for TSV positions on a data output path of the 3D semiconductor device 100 illustrated in FIG. 1. It should be noted that one option (one of Case I-V) is sufficient to implement a TSV connection of a data output path of a slave chip to a master chip. While the various options illustrated in FIG. 4 may not be mutually exclusive, a single option (i.e., only one of Cases I-V) may be implemented in a particular 3D semiconductor device and the other remaining options need not be implemented. However, all options are illustrated with respect to a single FIGURE for ease of explanation.

Referring to FIG. 4, the data output path for the master chip 110 and each of the slave chips 120, 130 and 140 includes a memory cell array block DRAM CORE 205, a data input/output driver/sense amplifier IODRV/IOSA 220, a read FIFO 222, a serializer SER 224, a data strobe output buffer 226, a data output buffer 228, a data strobe pad DQS, and a data input/output pad DQ.

On the data output path, the position of the TSV connections 160 may be set according to one of several boundary options. For example, in a fifth boundary option (Case V), each of the TSV connections 160 may connect to a respective node of the data output path between DRAM 205 and the data input/output driver/sense amplifier IODRV/IOSA 220. In a fourth boundary option (Case IV), each of the TSV connections 160 may connect to a respective node of the data output path between the data input/output driver/sense amplifier IODRV/IOSA 220 and the data input/output driver/sense amplifier IODRV/IOSA 220. For example, these nodes for Case IV may be immediately after the data input/output driver/sense amplifier IODRV/IOSA 220 or immediately before the read FIFO 222. In a third boundary option (Case III), each of the TSV connections 160 may connect to a respective one of storage nodes of the read FIFO 222 or to a respective one of output nodes of the FIFO 220 (as represented in FIG. 4). For example, if FIFO 222 comprises a plurality of flip-flop latches to store the data to be output, the TSV connections 160 may connect to respective ones of Q or Qbar nodes of each of these flip-flop type latches. In a second boundary option (Case II), the TSV connections 160 may connect to respective nodes of the data output path between serializer SER 224 and buffer 228, such as nodes immediately after the serializer 224 or immediately before buffer 228. In a first boundary option (Case I), the TSV connections may connect to respective ones of the data input/output pads DQ and the data strobe pad DQS or to respective locations of the data output path before the data input/output pads DQ and/or the data strobe pad DQS.

When the master chip 110 and the first through third slave chips 120, 130, and 140 are stacked and the position of the TSV connections 160 are set as the first through fifth boundaries Case I, Case II, Case III, Case IV, and Case V, respectively, outer circuit blocks of the TSV boundary in the first through third slave chips 120, 130, and 140 may not be used. In other words, when the position of the TSV connections 160 is set as the first boundary Case I at respective locations before the data input/output pads DQ or the data strobe pad DQS, the data input/output pads DQ or the data strobe pads DQS of the first through third slave chips 120, 130, and 140 are not used. The data input/output pads DQ and the data strobe pad DQS of the master chip 110 may be shared with the first through third slave chips 120, 130, and 140. The data input/output pads DQ and the data strobe pad DQS of the master chip 110 may be connected to the electrode pads 116a and 116b of the 3D semiconductor device 100.

When the position of the TSV connections 160 are set as in the second boundary Case II, the data strobe output buffers 226, the data output buffers 228, the data strobe pads DQS, and the data input/output pads DQ of the first through third slave chips 120, 130, and 140 need not be used. The data strobe output buffer 226, the data output buffer 228, the data input/output pad DQ, and the data strobe pad DQS of the master chip 110 are shared with the first through third slave chips 120, 130, and 140.

When the position of the TSV connections 160 are set as the third boundary Case III, circuit blocks disposed after the storage nodes of the read FIFO 222, i.e., the serializers SER 224, the data strobe output buffers 226, the data output buffers 228, the data strobe pads DQS, and the data input/output pads DQ of the first through third slave chips 120, 130, and 140 need not be used. The circuit blocks disposed after the storage nodes of the read FIFO 222, i.e., the serializer SER 224, the data strobe output buffer 226, the data output buffer 228, the data strobe pad DQS, and the data input/output pad DQ of the master chip 110 are shared with the first through third slave chips 120, 130, and 140.

When the position of the TSV connections 160 are set as the fourth boundary Case IV, the read FIFOs 222, the serializers SER 224, the data strobe output buffers 226, the data output buffers 228, the data strobe pads DQS, and the data input/output pads DQ of the first through third slave chips 120, 130, and 140 are not used. The read FIFO 222, the serializer SER 224, the data strobe output buffer 226, the data output buffer 228, the data strobe pad DQS, and the data input/output pad DQ of the master chip 110 are shared with the first through third slave chips 120, 130, and 140.

When the position of the TSV connections 160 are set as the fifth boundary Case V, the data input/output driver/sense amplifiers IODRV/IOSA 220, the read FIFOs 222, the serializers SER 224, the data strobe output buffers 226, the data output buffers 228, the data strobe pads DQS, and the data input/output pads DQ of the first through third slave chips 120, 130, and 140 need not be used. The data input/output driver/sense amplifier IODRV/IOSA 220, the read FIFO 222, the serializer SER 224, the data strobe output buffer 226, the data output buffer 228, the data strobe pad DQS, and the data input/output pad DQ of the master chip 110 are shared with the first through third slave chips 120, 130, and 140. For each of Cases I, II, III, IV and V, a portion of a data output path of a slave chip from an internal location of the data output path to a chip pad DQ may not be used. For example, when the 3D semiconductor device is packaged in a semiconductor package (e.g., encased in a protective molding material), the data chip pads DQ may not have any external conductor connection and ability to transmit data signals external to the package.

Also, the read FIFO 222 and the serializer SER 224 from among the circuit blocks on the data output path are controlled by a latency controller 262 and the delay synchronization circuit DLL 260. The latency controller 262 controls latency a number of clock cycles until read data is output to the data input/output pad DQ after a data read command is given. The latency controller 262 may control latency according to the operating speed of the semiconductor memory device 200. The delay synchronization circuit DLL 260 synchronizes internal clock signals with an externally supplied clock signal CLK (supplied from the outside the corresponding chip). Here, the synchronization circuit DLL 260 is a delayed locked loop circuit, but other clock synchronization circuits may be used, such as a phase locked loop circuit (PLL). The latency controller 262 operates in a DLL clock domain and is responsive to a clock signal output by the synchronization circuit DLL 260.

When the position of the TSV connections 160 on the data output path are set as the third, fourth or fifth boundary Case III, Case IV or Case V, the latency controller 262 and the delay synchronization circuit DLL 260 of the master chip 110 may be used by slave chips 120, 130 and 140. Case A in FIG. 4 represents TSV connections 160 between output nodes of latency controllers 262 of chips 110, 120, 130 and 140, and TSV connections between an output nodes of DLL 260 of chips 110, 120, 130 and 140. Case A TSV connections 160 may be implemented with any of Case III, Case IV and Case V. Thus, when TSV connections are set as with Case III, Case IV or Case V, Case A TSV connections 160 may allow for output(s) of the latency controller 262 of the master chip 110 to be utilized by slave chips 120, 130 and 140, to control latency (e.g., the latency between when an external read command is given to when data is output from master chip 110 input/output pads 110 (whether that data was stored and read from the DRAM core 205 of master chip 110, or one of the DRAM cores 205 of slave chips 120, 130 or 140). Controlling such latency may be achieved by controlling a timing of gating data from FIFOs 222 and serializer SER 224. In addition, when TSV connections 160 are set as with Case III, Case IV or Case V, Case A TSV connections 160 may allow for output(s) of the synchronization circuit DLL 260 of the master chip 110 (for example, an internal clock signal output by synchronization circuit DLL 260) to be utilized by slave chips 120, 130 and 140. When TSV connections are set as with Case III, Case IV or Case V, the latency controllers 262 and the delay synchronization circuits DLL 260 of the first through third slave chips 120, 130, and 140 are not used. When the position of the TSV connections 160 are set as the first or second boundary Case I or Case II, the latency controller 262 and the delay synchronization circuit DLL 260 of each of the master chip 110 and the first through third slave chips 120, 130, and 140 are utilized by their respective chips.

Table 2 shows characteristics of comparative examples for a 3D semiconductor device 100 using devices 200 as a master chip 110 and as slave chips 120, 130 and 140 (with a four DQ pads per chip) when the position of the TSV connections 160 on the data output path are set according to one of the first through fifth boundaries Case I, Case II, Case III, Case IV, and Case V.

TABLE 2

|  | Case I | Case II | Case III | Case IV | Case V |
|---|---|---|---|---|---|
| Data window | 0.5 * tCK | 0.5 * tCK | 16 * tCK | 2 or 4 * tCK | 4 * tCK |
| Number of TSVs | 4 | 4 | 128 | 8 or 16 | 1000 or more available according to structure |
| DLL control | M/S | M/S | Master Only | Master Only | Master Only |
| Seamless RD | poor | poor | good | average | average |
| Load-decoupling effects | X | good | good | good | good |
| tDQSCK/ tDQSQ | poor | poor | equivalent to DDP | equivalent to DDP | equivalent to DDP |

As shown in Table 2, as the position of the TSV 160 is closer to the fifth boundary Case V from the first boundary Case I, a data window becomes wider, and a data strobe-output access time tDQSCK and a data strobe edge-to-output data edge time tDQSQ from a clock signal CK/$\overline{CK}$ may be equivalent to a level of a double die package (DDP), and load-decoupling effects are provided. Also, a seamless read (seamless RD) characteristic in which a plurality of pieces of read data are continuously output may be improved, and is good for Case III where the data window is large with large data sizes (e.g., parts of 128 bits latched in each FIFO of each chip may be accessed sequentially by master chip 110). However, as the position of the TSV 160 is closer to the fifth boundary Case V from the first boundary Case I, the number of TSVs 160 increases.

Figure 5:
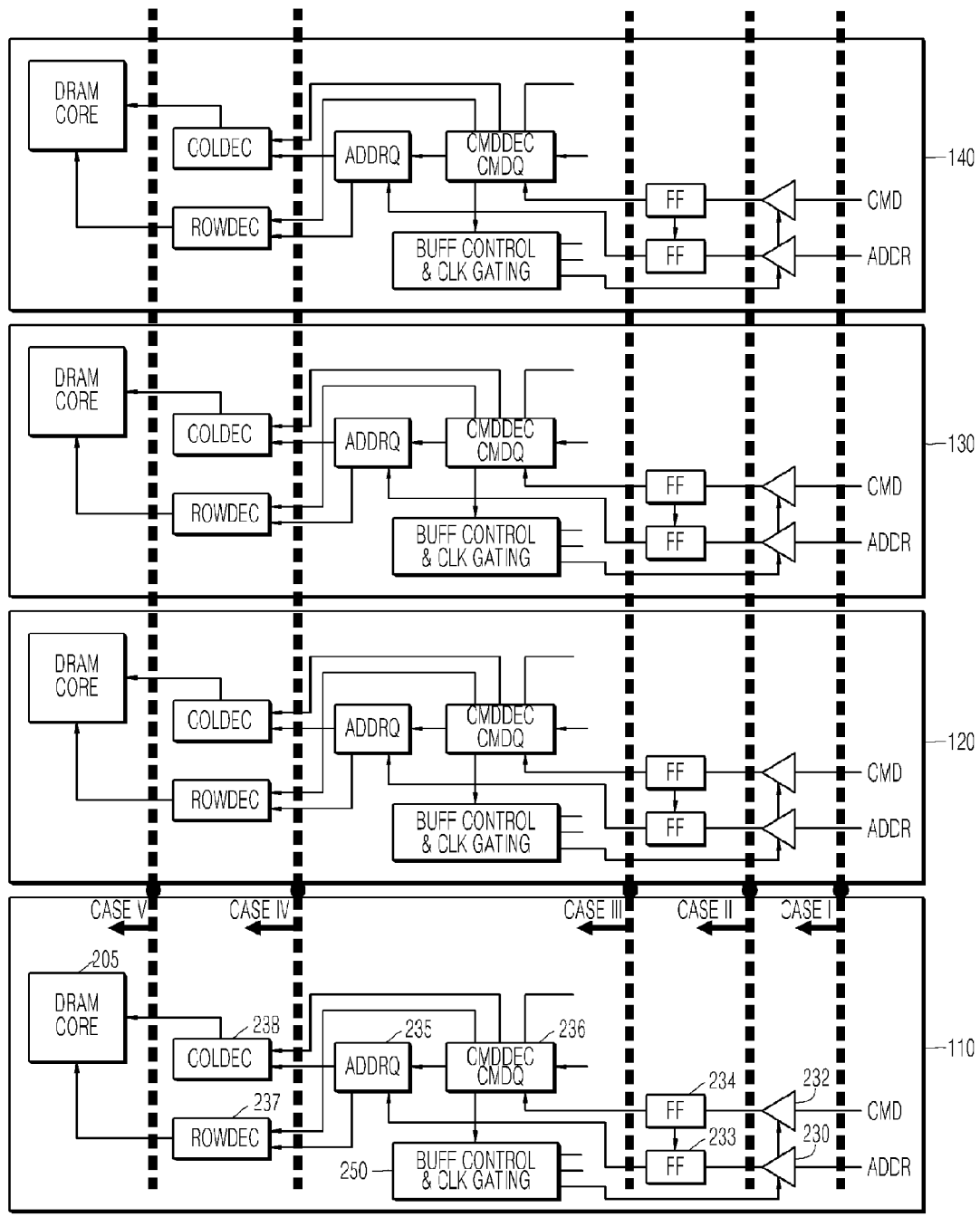
FIG. 5 illustrates an options for setting a TSV boundary on a command/address path of the 3D semiconductor device illustrated in FIG. 1.

FIG. 5 illustrates an options for setting a TSV boundary on a command/address path of the 3D semiconductor device 100 illustrated in FIG. 1. Referring to FIG. 5, the command/address path includes an address pads ADDR, a command pads CMD, an address input buffer 230, a command input buffer 232, flip flops FF 233 and 234, an address buffer ADDRQ 235, a command buffer and command decoder CMDDEC CMDQ 236, a row decoder ROWDEC 237, and a column decoder COLDEC 238.

On the command/address path, the position of the TSV connections 160 may be positioned at several boundary options, FIG. 5 showing four options (Cases I-IV). Case I represents the TSV connections within respective ones of the address pads ADDR and the command pads CMD of each chip, or electrical nodes of the address path and/or command path including the corresponding address pads ADDR and/or the command pads CMD. Case II represents TSV connections 160 to the address path portion of the command/address paths of each chip at respective locations between the address input buffer 230 and flip flops FF 233 and TSV connections 160 to the command path portion of the command/address path at respective locations between the command input buffer 232 and flip flops 234. These TSV connections 160 of Case II may be immediately after the address input buffer 230 and the command input buffer 232. Case III represents TSV connections to the command/address paths of each chip at respective locations between flip flops FF 233 and the address buffer ADDRQ 235 (for the address path portion) and flip flops FF 234 and command decoder CMDDEC CMDQ 236. These TSV connections 160 of Case III may be immediately after flip flops FF 233 and/or 234. Case IV represents TSV connections 160 to the command/address paths of each chip at respective locations between the address buffer ADDRQ 235 and address decoders, such as column decoder 238 and row decoder 237 (for the address path portion of the address/command path), and TSV connections 160 to the command/address paths of each chip at respective locations between the command buffer and command decoder CMDDEC CMDQ 236 and address decoders (such as column decoder 238 and row decoder 237). These TSV connection 160 for Case IV may be located immediately after the address buffer ADDRQ 235 and the command buffer and command decoder CMDDEC CMDQ 236. Case V represents TSV connections 160 to the command/address paths of each chip at respective locations between the address decoders such as column decoder 238 and row decoder 237 and the DRAM core 205. These TSV connections 160 for case V may be positioned immediately after the row decoder ROWDEC 237 and the column decoder COLDEC 238.

When the position of the TSV connections 160 on the command/address path are located at first through fifth boundaries of Case I, Case II, Case III, Case IV, and Case V, respectively, outer circuit blocks of the TSV boundary in the first through third slave chips 120, 130, and 140 may not be used. In other words, when the position of the TSV connections 160 are set as the first boundary Case I, the address pads ADDR and the command pads CMD of the first through third slave chips 120, 130, and 140 may not be used. The address pads ADDR and the command pads CMD of the master chip 110 are shared with the first through third slave chips 120, 130, and 140. The address pads ADDR and the command pads CMD of the master chip 110 may be connected to the electrode pads 116a and 116b of the 3D semiconductor device 100.

When the position of the TSV connections 160 are set as the second boundary Case II, the address pads ADDR, the command pads CMD, the address input buffers 230, and the command input buffers 232 of the first through third slave chips 120, 130, and 140 need not be used. The address pads ADDR, a command pads CMD, an address input buffer 230, a command input buffer 232 of the master chip 110 are shared with the first through third slave chips 120, 130, and 140.

When the position of the TSV connections 160 are set as the third boundary Case III, the address pads ADDR, the command pads CMD, the address input buffers 230, the command input buffers 232, and the flip flops FF 233 and 234 of the first through third slave chips 120, 130, and 140 need not be used. The address pads ADDR, the command pads CMD, the address input buffer 230, the command input buffer 232, and the flip flops FF 233 and 234 of the master chip 110 are shared by the first through third slave chips 120, 130, and 140.

When the position of the TSV connections 160 are set as the fourth boundary Case IV, the address pads ADDR, the command pads CMD, the address input buffers 230, the command input buffers 232, the flip flops FF 233 and 234, the address buffers ADDRQ 235, and the command buffers and command decoders CMDDEC CMDQ 236 of the first through third slave chips 120, 130, and 140 need not be used. The address pads ADDR, the command pads CMD, the address input buffer 230, the command input buffer 232, the flip flops FF 233 and 234, the address buffer ADDRQ 235, and the command buffer and command decoder CMDDEC CMDQ 236 of the master chip 110 are shared by the first through third slave chips 120, 130, and 140.

When the position of the TSV connections 160 are set as the fifth boundary Case V, the address pads ADDR, the command pads CMD, the address input buffers 230, the command input buffers 232, the flip flops FF 233 and 234, the address buffers ADDRQ 235, the command buffers and command decoders CMDDEC CMDQ 236, the row decoders ROW-DEC 237, and the column decoders COLDEC 238 of the first through third slave chips 120, 130, and 140 need not be used. The address pads ADDR, the command pads CMD, the address input buffer 230, the command input buffer 232, the flip flops FF 233 and 234, the address buffer ADDRQ 235, the command buffer and command decoder CMDDEC CMDQ 236, the row decoder ROWDEC 237, and the column decoder COLDEC 238 of the master chip 110 are shared with the first through third slave chips 120, 130, and 140. For each of Cases I, II, III, IV and V, a portion of the address path of the slave chip from an address ADDR chip pad to a location of the address path internal to the slave chip may not be used. For example, when the 3D semiconductor device is packaged in a semiconductor package (e.g., encased in a protective molding material), the address chip pads ADDR may not have any external conductor connection and no signal connection for inputting an address signal. For each of Cases I, II, III, IV and V, a portion of the command path of a slave chip from a command chip pad CMD to a location of the address path internal to the slave chip may not be used. For example, when the 3D semiconductor device is packaged in a semiconductor package (e.g., encased in a protective molding material), the command chip pads CMD may not have any external conductor connection and no signal connection for inputting a command signal.

Table 3 shows characteristics of comparative examples for a 3D semiconductor device 100 using devices 200 as a master chip 110 and as slave chips 120, 130 and 140 (with four DQ pads per chip) when the positions of the TSV connections 160 on the data output path are set as the first through fifth boundaries Case I, Case II, Case III, Case IV, and Case V.

TABLE 3

|  | Case I | Case II | Case III | Case IV | Case V |
|---|---|---|---|---|---|
| Data window | 1 * tCK | 1 * tCK | 1 * tCK | 4 * tCK | 4 * tCK |
| Number of TSVs | 30 or more | 30 or more | 30 or more | 100 or more available according to structure | several thousands available according to structure |
| Load-decoupling effects | X | ○ | ○ | ○ | ○ |
| tDS/DH | poor | poor | good | good | good |

As shown in Table 3, as the position of the TSV 160 is closer to the fifth boundary Case V from the first boundary Case I, a data window becomes wider, and a data setup/hold time is good, and load-decoupling effects are provided. However, as the position of the TSV 160 is closer to the fifth boundary Case V from the first boundary Case I, the number of TSVs 160 increases.

Figure 6:
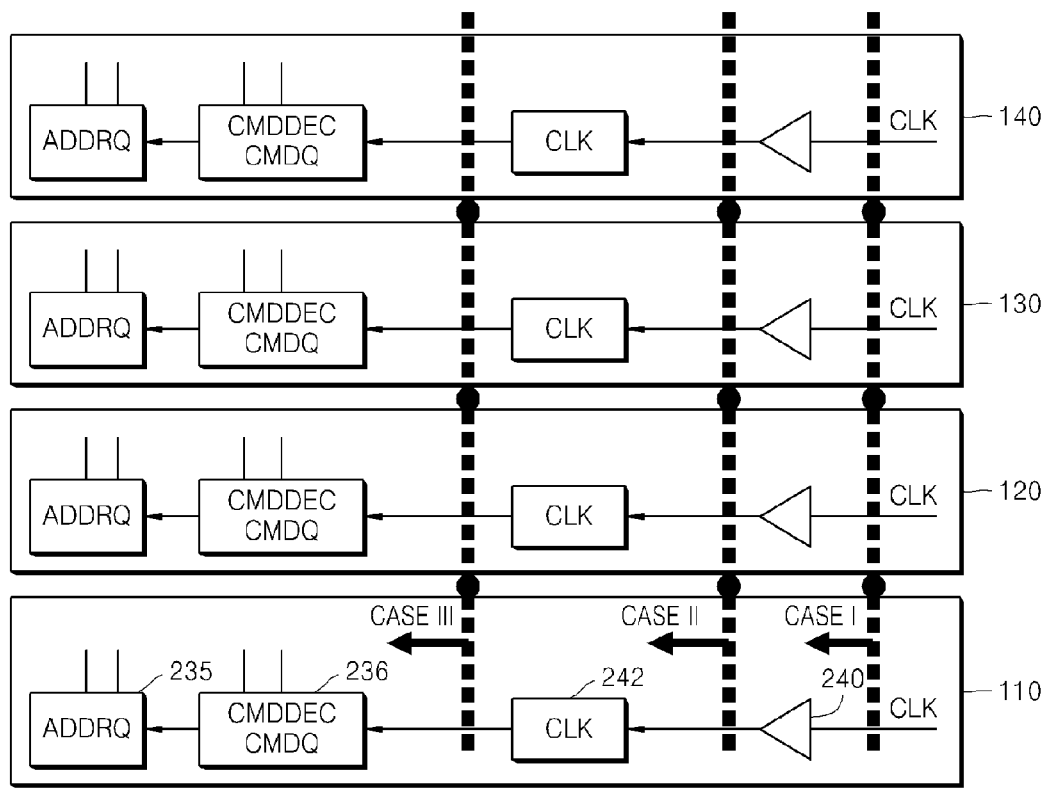
FIG. 6 illustrates an options for setting a TSV boundary on a clock path of the 3D semiconductor device illustrated in FIG. 1.

FIG. 6 illustrates an options for setting a TSV boundary on a clock path of the 3D semiconductor device illustrated in FIG. 1. Referring to FIG. 6, a clock path includes a clock pad CLK, a clock input buffer 240, and a clock generator and buffer circuit CLK 242. Each of chips 110, 120, 130 and 140 may have an original design to allow a clock signal, input from an external source on clock pad CLK, may be buffered by buffer 240. Clock generator 242 receives the buffered clock signal output by buffer 240 and generates one or more internal clock signals, which may be used by internal circuitry, such as command decoder and command buffer CMDDEC CMDQ 236 and address buffer ADDRQ 235.

On the clock path, the position of the TSV connections 160 between chips 110, 120, 130 and 140 may be positioned at several boundaries. For example, a first boundary Case I represents one or more TSV connections 160 of corresponding clock pad(s) CLK of the chips or at electrical nodes including the clock pad(s) CLK but after the clock pad(s) CLK. Case II represents one or more TSV connections 160 at nodes located on the clock bath between the clock input buffer 240 and the clock generator and buffer circuit CLK 242. This Case II location may be positioned immediately after the clock input buffer 240 or immediately before the clock generator and buffer circuit CLK 242. Case III represents one or more TSV connections 160 of corresponding internal clock signals output by the clock generator and buffer circuit CLK 242. Case III TSV connections 160 may be located immediately after the clock generator and buffer circuit CLK 242 or further downstream.

When the position of the TSV connections 160 on the clock path are positioned as one of the first through third boundaries Case I, Case II, and Case III, respectively, circuit blocks outside of the TSV boundary in the first through third slave chips 120, 130, and 140 may not be used. When the position of the TSV connection(s) 160 is set as the first boundary Case I, the clock pads CLK of the first through third slave chips 120, 130, and 140 may not be used. The clock pad CLK of the master chip 110 is shared with the first through third slave chips 120, 130, and 140. The clock pad(s) CLK of the master chip 110 may be connected to the electrode pad(s) 116*a* of the 3D semiconductor device 100.

When the position of the TSV 160 is set as the second boundary Case II, the clock pads CLK and the clock input buffers 240 of the first through third slave chips 120, 130, and 140 need not be used. The clock pad(s) CLK and the clock input buffer 240 of the master chip 110 are shared with the first through third slave chips 120, 130, and 140.

When the position of the TSV 160 is set as the third boundary Case III, the clock pads CLK, the clock input buffers 240, and the clock generator and buffer circuits 242 of the first through third slave chips 120, 130, and 140 need not be used. The clock pad CLK, the clock input buffer 240, and the clock generator and buffer circuit 242 of the master chip 110 are shared with the first through third slave chips 120, 130, and 140. For each of Cases I, II, III, a portion of the clock path of the slave chip from a clock chip pad CLK to a location of the clock path internal to the slave chip may not be used. For example, when the 3D semiconductor device is packaged in a semiconductor package (e.g., encased in a protective molding material), the clock chip pads CLK may not have any external conductor connection and no signal connection for inputting a clock signal.

The TSV boundary when the master chip 110 and the first through third slave chips 120, 130, and 140 are stacked, may be set in consideration of the number of TSV connections 160, the sizes of the first through third slave chips 120, 130, and 140, immunity or lessened sensitivity to TSV variation, load-decoupling, simplicity of design of a logic circuit, or the like. In particular, on the data input path, the data output path and the address/command path, as the position of the TSV connections 160 is closer to the fifth boundary Case V from the first boundary Case I, the number of TSV connections 160 increases. Thus, the area of the master chip 110 and the areas of the first through third slave chips 120, 130, and 140 that are designed to be of the same type may be increased. Since the pitch/size of the TSV 160 is determined according to a design rule of a semiconductor manufacturing process, an optimum boundary of the first through fifth boundaries Case I, Case II, Case III, Case IV, and Case V may be determined in consideration of the design rule of the semiconductor manufacturing process.

When the master chip 110 and the first through third slave chips 120, 130, and 140 are different types of chips, circuit blocks that are not to be used in the first through third slave chips 120, 130, and 140 may not be designed and manufactured. Thus, the areas of the first through third slave chips 120, 130, and 140 may be less than the area of the master chip 110.

The position of the TSV 160 of the data output path illustrated in FIG. 4 may be set as the fourth boundary Case IV in consideration of immunity or lessened response to TSV variation and simple design of the logic circuit. Thus, the read FIFOs 222, the serializers SER 224, the data strobe output buffers 226, the data output buffers 228, the data strobe pads DQS, and the data input/output pads DQ of the first through third slave chips 120, 130, and 140 need not be used, and the read FIFO 222, the serializer SER 224, the data strobe output buffer 226, the data output buffer 228, the data strobe pad DQS, and the data input/output pad DQ of the master chip 110 are shared with the first through third slave chips 120, 130, and 140.

Variation elements in the semiconductor manufacturing process may be present between the stacked, first through third slave chips 120, 130, and 140. In this case, times at which the plurality of pieces of read data output from the first through third slave chips 120, 130, and 140 reach the read FIFO 222 of the master chip 110 via the TSVs 160, may be different. The read FIFO 222 of the master chip 110 may not track individual delay times of the read data output from the first through third slave chips 120, 130, and 140. In order to solve the problem, the master chip 110 and the first through third slave chips 120, 130, and 140 include read FIFO controllers illustrated in FIG. 7.

Figure 7:
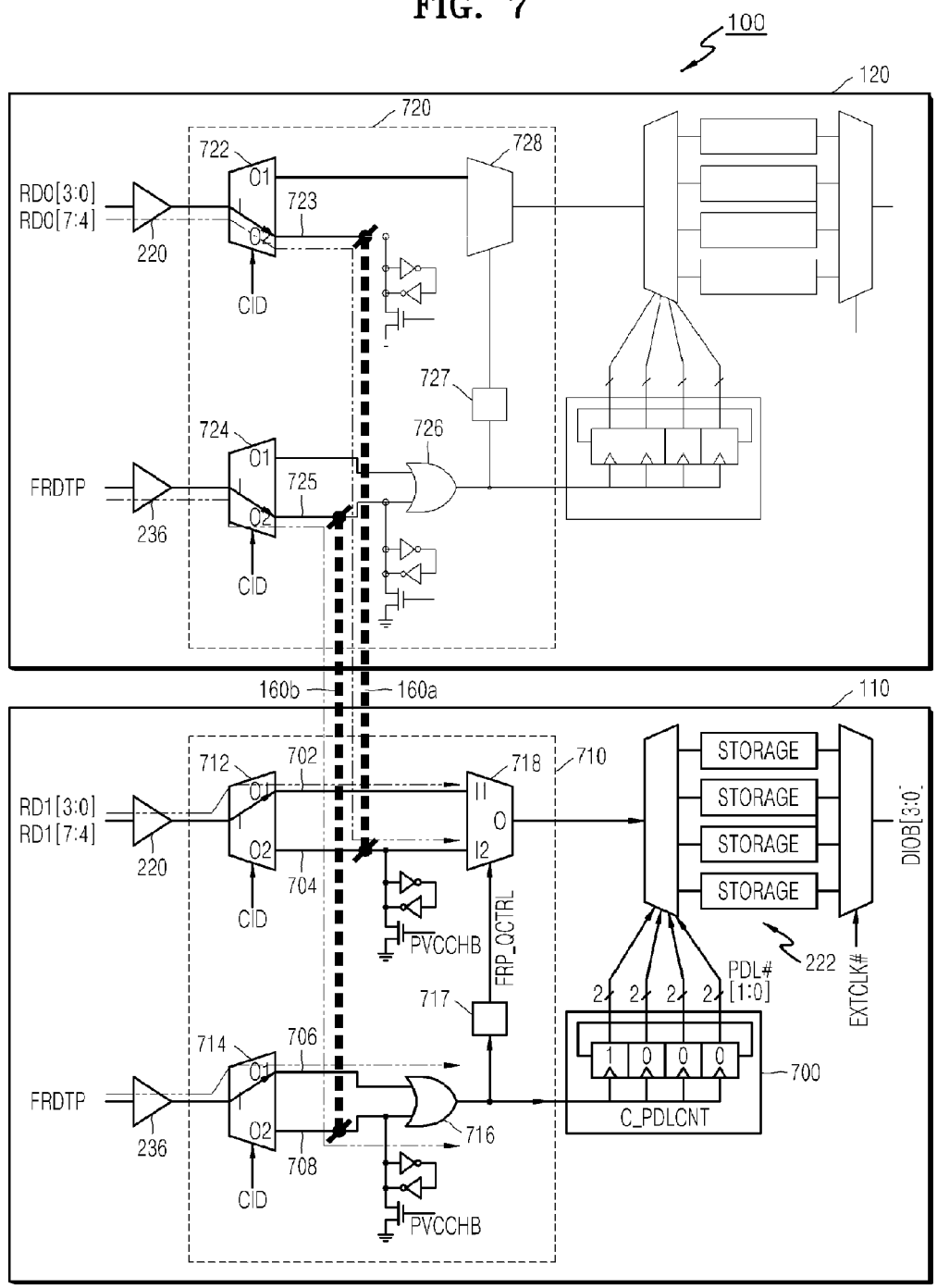
FIG. 7 illustrates read first-in/first-out (FiFo) controllers according to an embodiment.

FIG. 7 illustrates read FIFO controllers 710 and 720 according to an embodiment. In FIG. 7, for convenience of explanation, the read FIFO controller 710 included in the master chip 110 and read FIFO controller 720 included in the first slave chip 120 directly stacked on the master chip 110 will be described, however, it should be understood that all chips in the 3D semiconductor device may include a FIFO controller. The master chip 110 includes the data input/output driver/sense amplifier IODRV/IOSA 220 that read data RD1[3:0] and RD1[7:4] output from the memory cell array block 205 (see FIGS. 2 and 4). The read data RD1[3:0] and RD1[7:4] may be transmitted sequentially (e.g., read data RD1[3:0] followed by read data RD1[7:4]) to FIFO controller 710. The master chip 110 also includes the command buffer and command decoder CMDDEC CMDQ 236 that drives a first alignment signal FRP_PDL generated from a read command, a counter 700 that generates a third alignment signal PDL#[1:0] in response to the first alignment signal FRP_PDL supplied by the master chip 110 or the first slave chip 120, the read FIFO controller 710 that transmits the read data RD1[3:0] and RD1[7:4] of the master chip 110 and read data RD0[3:0] and RD0[7:4] of the first slave chip 120 in response to a chip identification signal CID and the first alignment signal FRP_PDL, and a read FIFO 222 that sequentially stores the read data RD1[3:0] and RD1[7:4] of the master chip 110 and read data RD0[3:0] and RD0[7:4] of the first slave chip 120 in response to the third alignment signal PDL#[1:0].

The first slave chip 120 may be manufactured to have the same structure as that of the master chip 110. As illustrated in FIG. 4, when the position of the TSV connections 160 on the data output path are set as the fourth boundary Case IV, the read FIFO 222 and circuit blocks disposed after the read FIFO 222, i.e., the serializer SER 224, the data strobe output buffer 226, the data output buffer 228, the data strobe pad DQS, and the data input/output pad DQ of the first slave chip 120 need not be used. In the current embodiment, outputs of first and second demultiplexers (DEMUX) 722 and 724 in the read FIFO controller 720 of the first slave chip 120 are connected to outputs of first and second DEMUX circuits 712 and 714 of the master chip 110 via first and second TSV connections 160a and 160b. Thus, a MUX circuit 728, an OR gate 726, and a logic circuit 727 in the read FIFO controller 720 of the first slave chip 120 need not be used. A MUX circuit 718, an OR gate 716, a logic circuit 717 in the read FIFO controller 710 of the master chip 110 are shared with the first slave chip 120.

The read FIFO controller 710 of the master chip 110 includes the first and second DEMUX 712 and 714, and MUX 718, the OR gate 716, and the logic circuit 717. The first DEMUX 712 includes one input terminal I and two output terminals O1 and O2. The input terminal I of the first DEMUX circuit 712 inputs four bit input data (e.g., sequentially inputs data RD1[3:0] followed by RD1[7:4]) transmitted via the data input/output driver/sense amplifier IODRV/IOSA 220. The first DEMUX circuit 712 outputs the four bit input data (e.g., the read data RD1[3:0] or RD1[7:4]) to the first output terminal O1 connected to a first signal line 702 in response to the chip identification signal CID of the master chip 110. The second output terminal O2 of the first DEMUX circuit 712 is connected to a second signal line 704. The second signal line 704 is connected to a first TSV connection 160a for connecting the master chip 110 and the first slave chip 120. For example, the chip identification signal CID of the master chip 110 may be set as "0", and the chip identification signal CID of the first slave chip 120 may be set as "1".

The second signal line 704 is connected to an output of the first DEMUX circuit 722 of the first slave chip 120 via the first TSV 160. The first DEMUX circuit 722 of the first slave chip 120 sequentially inputs the read data RD0[3:0] and RD0[7:4] of the first slave chip 120 at its input terminal I and sequentially outputs the read data RD0[3:0] and RD0[7:4] to the second output terminal O2 connected to a second signal line 723 in response to the chip identification signal CID of the first slave chip 120. The second signal line 723 of the first slave chip 120 is connected to the second signal line 704 of the master chip 110 via the first TSV 160a. Thus, the read data RD0[3:0] and RD0[7:4] of the first slave chip 120 are transmitted (in this example, sequentially transmitted) to the second signal line 704 of the master chip 110.

The second DEMUX circuit 714 includes one input terminal I and two output terminals O1 and O2. The second DEMUX circuit 714 inputs the first alignment signal FRP_PDL, which is driven by the command buffer and command decoder CMDDEC CMDQ 236, to the input terminal I. The second DEMUX circuit 714 outputs the first alignment signal FRP_PDL to the first output terminal O1 connected to a third signal line 706 in response to the chip identification signal CID of the master chip 110. The second output terminal O2 of the second DEMUX circuit 714 is connected to a fourth signal line 708. The fourth signal line 708 is connected to the second TSV 160b for connecting the master chip 110 and the first slave chip 120.

The fourth signal line 708 is connected to an output of the second DEMUX circuit 724 of the first slave chip 120 via the second TSV connection 160b. The second DEMUX circuit 724 of the first slave chip 120 inputs the first alignment signal FRP_PDL of the first slave chip 120 to the input terminal I and outputs the first alignment signal FRP_PDL to the second output terminal O2 connected to a fourth signal line 725 in response to the chip identification signal CID of the first slave chip 120. The fourth signal line 725 of the first slave chip 120 is connected to the fourth signal line 708 of the master chip 110 via the second TSV connection 160b. Thus, the first alignment signal FRP_PDL of the first slave chip 120 is transmitted to the fourth signal line 708 of the master chip 110.

The third signal line 706 to which the first alignment signal FRP_PDL of the master chip 110 is transmitted, and the fourth signal line 708 to which the first alignment signal FRP_PDL of the first slave chip 120 is transmitted, are connected to the OR gate 716. The output of the OR gate 716, signal FRP_PDLD resulting from a logical OR operation of the FRP_PDL signals of the master chip 110 and the first slave chip 120, is transmitted to logic circuit 717. Logic circuit 717 generates a second alignment signal FRP_QCTRL in response to FRP_PDLD, containing information of the first alignment signal FRP_PDL of the master chip 110 and the first alignment signal FRP_PDL of the first slave chip 120. Logic circuit 717 may be a toggle flip-flop having an output that is toggled in response to the rising edge of signal FRP_PDLD. Logic circuit 727 may also be a toggle flip-flop of the same design as logic circuit 717. Also, signal FRP_PDLD output from the OR gate 716 is provided to a counter 700 and which generates the third alignment signal PDL#[1:0] that is used to sequentially store the read data RD1[3:0] and RD1[7:4] of the master chip 110 and the read data RD0[3:0] and RD0[7:4] of the first slave chip 120 in the read FIFO 222.

The MUX circuit 718 includes two input terminals I1 and I2 and one output terminal O. In the MUX circuit 718, the first signal line 702 to which the read data RD1[3:0] and RD1[7:4] of the master chip 110 are transmitted, is connected to the first input terminal I1, and the second signal line 704 to which the read data RD0[3:0] and RD0[7:4] of the first slave chip 120 are transmitted, is connected to the second input terminal I2. The MUX circuit 718 outputs the read data RD1[3:0] and RD1[7:4] of the master chip 110 and the read data RD0[3:0] and RD0[7:4] of the first slave chip 120, which are input to the first and second input terminals I1 and I2, to the output terminal O in response to the second alignment signal FRP_QCTRL. The output terminal O of the MUX circuit 718 is connected to the read FIFO 222.

The read FIFO 222 sequentially stores the read data RD1[3:0] and RD1[7:4] of the first slave chip 120 and the read data RD0[3:0] and RD0[7:4] of the master chip 110 in response to the third alignment signal PDL#[1:0]. The read data RD1[3:0] and RD1[7:4] of the master chip 110 and the read data RD0[3:0] and RD0[7:4] of the first slave chip 120 stored in the read FIFO 222 are sequentially output in response to a FIFO output control signal EXTCLK#(DOI<3:0>).

Even when the read data RD0[3:0] and RD0[7:4] of the first slave chip 120 reach the master chip 110 at a different delay time from that of the read data RD1[3:0] and RD1[7:4] of the master chip 110, the MUX circuit 718 of the read FIFO controller 710 of the master chip 110 selectively transmits the read data RD0[3:0] and RD0[7:4] of the first slave chip 120 and the read data RD1[3:0] and RD1[7:4] of the master chip 110 to the read FIFO 222. A current burn phenomenon may be avoided. The current burn phenomenon will be described with reference to FIG. 8 that is alternative embodiment of the master chip 110 and the first slave chip 120 illustrated in FIG. 7.

Figure 8:
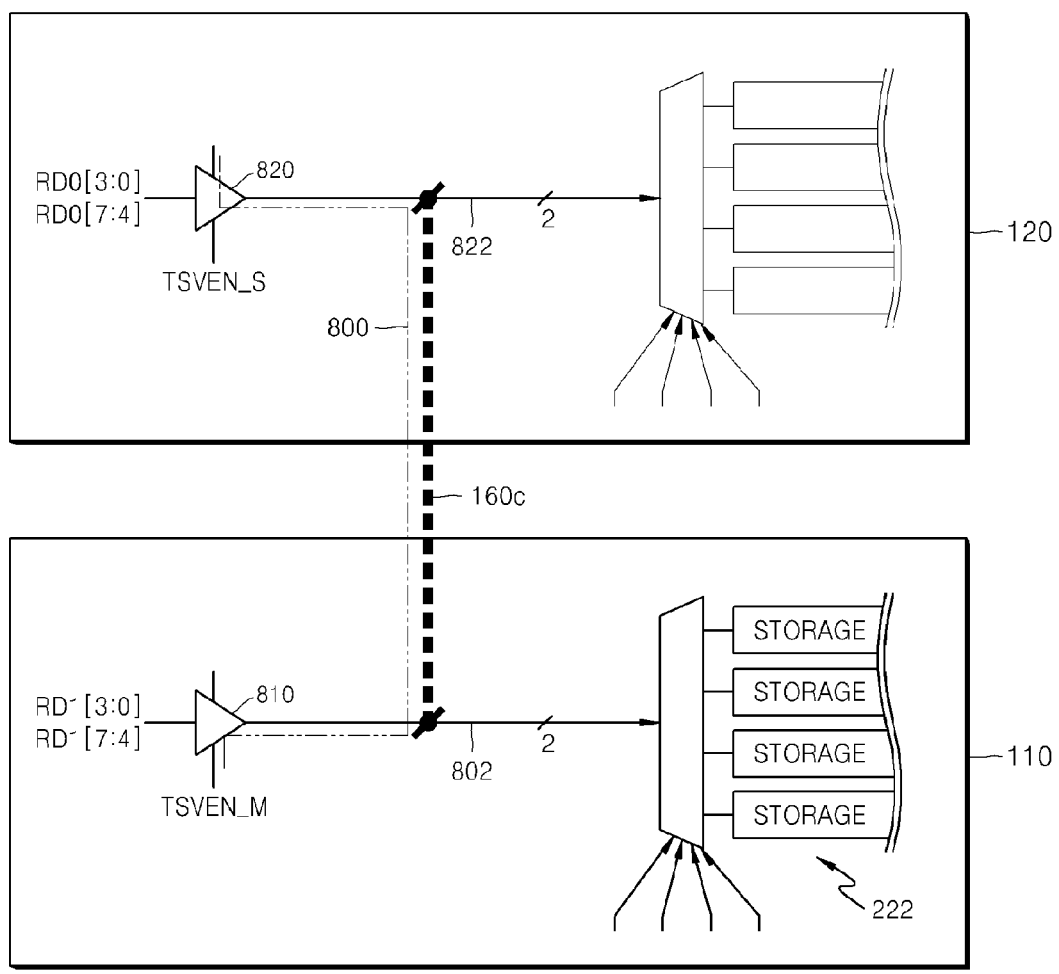
FIG. 8 illustrates an alternative embodiment.

FIG. 8 illustrates an alternative embodiment to store data in FIFO 222 where the read data RD1[3:0] and RD1[7:4] of the master chip 110 are transmitted to a first signal line 802 via a first tri-state buffer 810 that responds to a first enable signal TSVEN_M. The first enable signal TSVEN_M is generated in the master chip 110. The read data RD0[3:0] and RD0[7:4] of the first slave chip 120 are transmitted to a second signal line 822 via a second tri-state buffer 820 that responds to a second enable signal TSVEN_S. The second enable signal TSVEN_S is generated in the first slave chip 120. The second signal line 822 is connected to the first signal line 802 via a TSV 160c. The read data RD0[3:0] and RD0[7:4] of the first slave chip 120 are transmitted to the first signal line 802 via the TSV 160c. The read data RD1[3:0] and RD1[7:4] of the master chip 110 transmitted to the first signal line 802 and the read data RD0[3:0] and RD0[7:4] of the first slave chip 120 are sequentially stored in the read FIFO 222 and then are output.

Due to the variation elements of the master chip 110 and the first slave chip 120 during the semiconductor manufacturing process, a time at which the read data RD1[3:0] and RD1[7:4] of the master chip 110 reaches the read FIFO 222, and a time at which the read data RD0[3:0] and RD0[7:4] of the first slave chip 120 reaches the read FIFO 222 may be different from each other. When a gapless data output operation of the read data RD1[3:0] and RD1[7:4] of the master chip 110 and the read data RD0[3:0] and RD0[7:4] of the first slave chip 120 is performed, read data collision may occur in the first signal line 802, the TSV 160, and the second signal line 822. For example, the read data RD0[3:0] and RD0[7:4] of the first slave chip 120 is at a logic high level and the read data RD1[3:0] and RD1[7:4] of the master chip 110 is at a logic low level, a current path 800 is formed between the second tri-state buffer 820, the first signal line 802, the TSV 160, and the first tri-state buffer 810. The current burn phenomenon may occur due to the current path 800.

The current burn phenomenon that occurs when the gapless data output operation is performed, may be avoided by the read FIFO controller 710 that controls the read FIFO 222 to transmit the read data RD0[3:0] and RD0[7:4] of the first slave chip 120 and the read data RD1[3:0] and RD1[7:4] of the master chip 110 to the master chip 110 via the separate, first and second signal lines 702 and 704 and controls the MUX circuit 718 to selectively transmit the read data RD0[3:0] and RD0[7:4] of the first slave chip 120 and the read data RD1[3:0] and RD1[7:4] of the master chip 110 to the read FIFO 222.

Each of the first and second tri-state buffers 810 and 820 illustrated in FIG. 8 drives the read data RD1[3:0] and RD1[7:4] of the master chip 110 and the read data RD0[3:0] and RD0[7:4] of the first slave chip 120 in response to the first and second enable signals TSVEN_M and TSVEN_S generated in the master chip 110 and the first slave chip 120. On the other hand, the read FIFO controllers 710 and 720 illustrated in FIG. 7 selectively transmit the read data RD0[3:0] and RD0[7:4] of the first slave chip 120 and the read data RD1[3:0] and RD1[7:4] of the master chip 110 in response to the chip identification signal CID of each of the master chip 110 and the first slave chip 120. Thus, the master chip 110 and the first slave chip 120 illustrated in FIG. 7 may not need additional circuit blocks for generating the first and second enable signals TSVEN_M and TSVEN_S.

Figure 9:
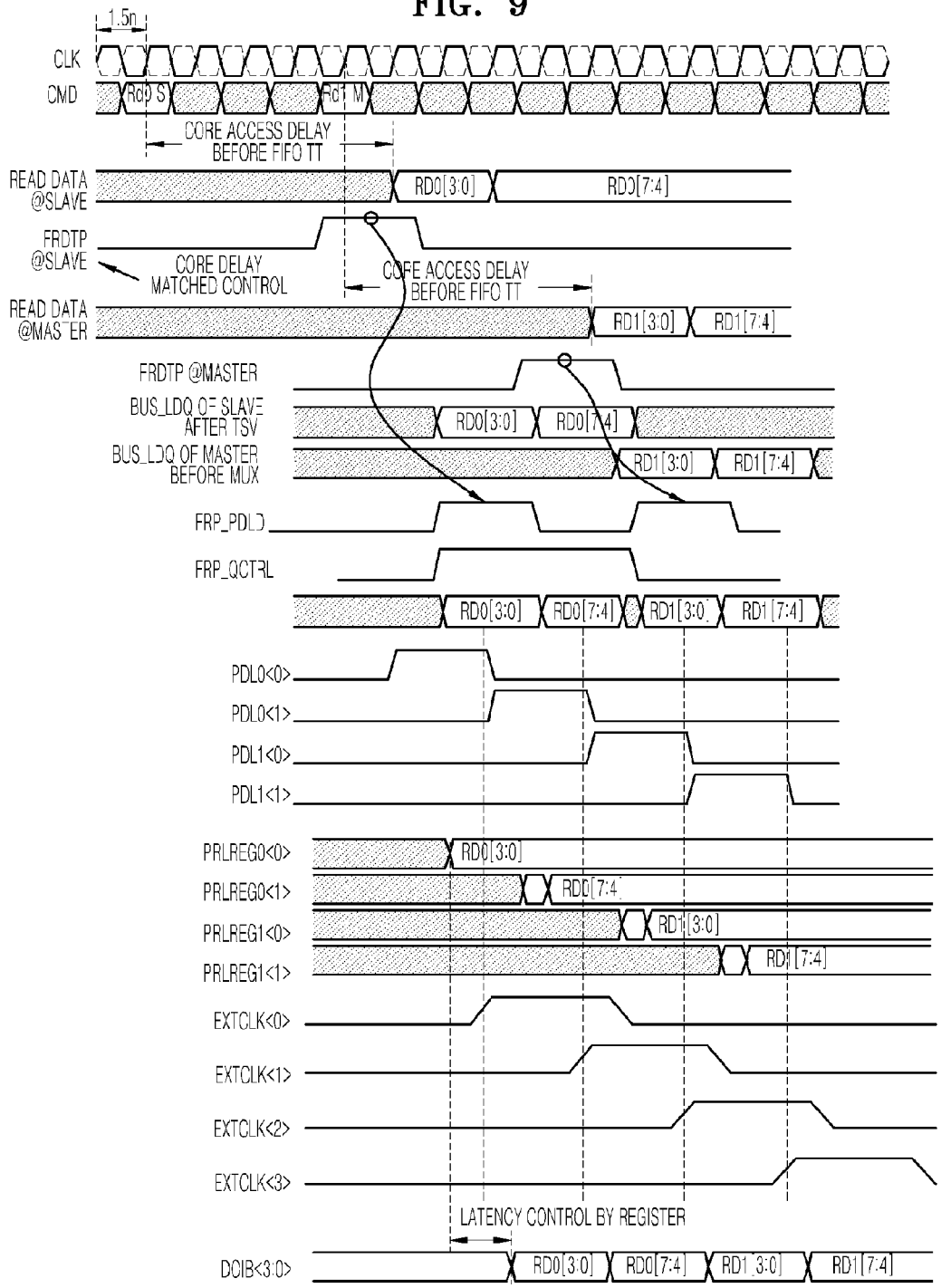
FIG. 9 is an operational timing diagram of the read FiFo controllers illustrated in FIG. 7.

An operating timing diagram of the read FIFO controllers 710 and 720 illustrated in FIG. 7 of the 3D semiconductor device 100 described above is shown in FIG. 9. Referring to FIG. 9, the read data RD0[3:0] and RD0[7:4] of the first slave chip 120 and a first alignment signal FRDTP are provided, and the read data RD1[3:0] and RD1[7:4] of the master chip 110 and a first alignment signal FRDTP are provided. The read data RD0[3:0] and RD0[7:4] of the first slave chip 120 are transmitted to the second signal line 704 of the master chip 110, and the read data RD1[3:0] and RD1[7:4] of the master chip 110 are transmitted to the first signal line 702 of the master chip 110. Signal FRP_PDLD is generated from a logical OR operation of the FRDTP signals of the first slave chip 120 and the master chip 110. The second alignment signal FRP_QCTRL is generated by logic circuit 717 in response to signal FRP_PDLD. The read data RD1[3:0] and RD1[7:4] of the first slave chip 120 and the read data RD0[3:0] and RD0[7:4] of the master chip 110 are transmitted to the read FIFO 222 in response to the second alignment signal FRP_QCTRL, which is used to select the input of multiplexer 718. The read FIFO 222 sequentially stores the read data RD1[3:0] and RD1[7:4] of the first slave chip 120 and the read data RD0[3:0] and RD0[7:4] of the master chip 110 in response to the third alignment signal PDL#[1:0]. The read data RD1[3:0] and RD1[7:4] of the first slave chip 120 and the read data RD0[3:0] and RD0[7:4] of the master chip 110, which are stored in the read FIFO 222, are sequentially output in response to the FIFO output control signal EXTCLK# (DOI<3:0>).

As noted above, FIG. 7 illustrates an example of the 3D semiconductor device 100 comprising a master chip 110 and a single slave chip (first slave chip 120). When additional slave chips are desired, the TSV connections 160 illustrated in FIG. 7 may be extended to the additional slave chips, resulting in the TSV connections 160a and 160b being shared with the additional slave chips. Alternatively, for each additional slave chip added, a dedicated signal line may be added to the master chip 110 as an additional input to multiplexer 718 (similar to signal line 704 of the master chip) and a dedicated signal line may be added as an additional input to OR gate 716 (similar to signal line 708 of the master chip), with two additional TSV connections 160 (similar to TSV connections 160a and 160b) extending from these additional dedicated signal lines in the master chip 110 to the signal lines 723 and 725 of the additional slave chip. As will be recognized, other circuitry of the master chip 110 should be modified to accommodate such a change, including, e.g., modification of multiplexer 718 and OR gate 716 to accommodate the additional inputs.

As a further example, slave chips may be divided into sets that share TSV connections 160. For example, first TSV connections 160 may be dedicated to connect a first set of slave chips to the master chip 110 and second TSV connections 160 may be dedicated to connect a second set of slave chips to the master chip 110. Further, the slave chips that share the TSV connections 160 may be chosen (or given a chip ID (CID) or otherwise programmed) such that slave chips in the same set do not sequentially output data with respect to one another. For example, data outputs of a first set of slave chips to their respective FIFO controllers that share first TSV connections 160 (e.g., dedicated to the first set) and data outputs of a second set of slave chips to their respective FIFO controllers that share second TSV connections (e.g., dedicated to the second set) may be interleaved in time. For example, the slave chips of the first set may output data to their FIFO controllers at times t0, t2, t4 and t6, where slave chips of the second set may output data to FIFO controller at times t1, t3 and t5 (and the master chip may output data to FIFO 710 at time t7). By separating usage of the TSV connections 160, the risk of current burn may be reduced while also reducing circuitry.

Figure 10:
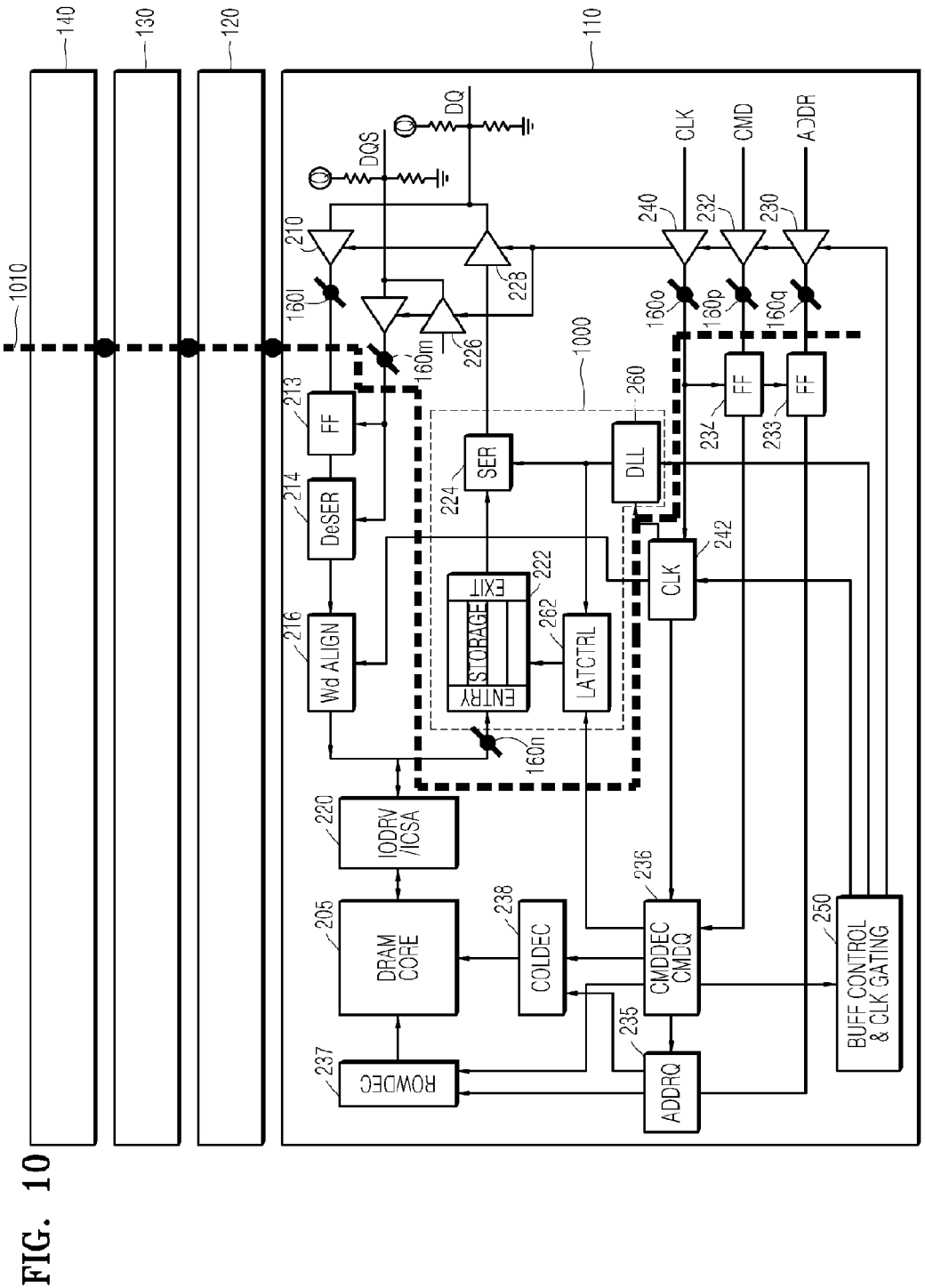
FIG. 10 illustrates a global controlling operation of the 3D semiconductor device illustrated in FIG. 1.

FIG. 10 illustrates a global controlling operation of the 3D semiconductor device 100 illustrated in FIG. 1. Referring to FIG. 10, each of the master chip 110 and the first through third slave chips 120, 130, and 140 stacked in the 3D semiconductor device 100 illustrated in FIG. 1 may have the same circuit design as the semiconductor memory device 200 illustrated in FIG. 2 described above. The 3D semiconductor device 100 includes a plurality of ranks including the master chip 110 and the first through third slave chips 120, 130, and 140. The plurality of ranks may be defined as a set of DRAM chips to which an identical command pad CMD and an address pad ADDR are input. Generally, the ranks are distinguished by a chip selection signal CS. For example, the master chip 110 that is a first rank is driven by a first chip selection signal CS0, and the first slave chip 120 that is a second rank is driven by a second chip selection signal CS1, and the second slave chip 130 that is a third rank is driven by a third chip selection signal CS2, and the third slave chip 140 that is a fourth rank is driven by a fourth chip selection signal CS3. The chip selection signals CS0, CS1, CS2 and CS3 may be applied to the command pad CMD or to other pads, as is known in the art. In addition, the chip selection signals may be applied in a manner similar to commands are applied via command pad CMD—e.g., separate chip select pads may be provided, and through-substrate via connections may connect to a chip select path of the master chip to chip select paths of the slave chips in the manner shown and described herein with respect to commands and the command paths of the master and slave chips.

When all of the master chip 110 and the first through third slave chips 120, 130, and 140 operate together, logic circuits that control the master chip 110 and the first through third slave chips 120, 130, and 140 are disposed in the master chip 110. For example, when the position of the TSV connections 160 on the data output path are positioned as the fourth boundary case IV (see FIG. 4, e.g.), the delay synchronization circuit DLL 260, the latency controller 262, the read FIFO 222, the serializer SER 224, and data input/output, command, and address-related logic circuits constitute a global controlling circuit 1000 that controls the output of data of the master chip 110 and the data of the first through third slave chips 120, 130, and 140. The global controlling circuit 1000 of the master chip 110 may operate even though a read operation is performed in any chip of one of the first through fourth ranks (e.g., the read operation is performed in any chip of the master chip 110 and first through third slave chips 120, 130 and 140).

FIG. 10 also illustrates an example TSV boundary 1010 of implementing several of the TSV connection boundary options discussed with respect to FIGS. 3, 4, 5 and 6. Specifically, the TSV connection boundary of the data input path is set as Case II (as discussed with respect to FIG. 3) in the example of FIG. 10, with TSV connections 160a to the data input path at corresponding positions between the data input buffer 210 and flip flop 213. The TSV connection boundary of the data output path is set as Case IV (as discussed with respect to FIG. 4) in the example of FIG. 10, with TSV connections 160b to the data output path at corresponding positions between data input/output driver/sense amplifiers IODRV/IOSA 220 and FIFOs 222. The TSV connection boundary of the command/address path is set as Case II (as discussed with respect to FIG. 5) with TSV connections 160c to the command path and the address path respectively set between command input buffers 232 and flip flops 234, and between address input buffers 230 and flip flops 233. The TSV connection boundary of the clock path is set as Case II (as discussed with respect to FIG. 6), with TSV connections 160d to the clock path set at locations between clock input buffers 240 and clock generator and buffer circuit CLK 242. The TSV boundary is represented by the thick dashed line 1010 in FIG. 10. The TSV connections 160*l*, 160*m*, 160*n*, 160*o*, 160*p* and 160*q* are represented by a dot with a slash in FIG. 10, where each dot with a slash is a symbol representing one or a plurality of TSV connections 160, the number of TSV connections depending on the number of signal lines to be connected between the chips (e.g., if the connection is to a four bit wide internal data bus, a TSV connection symbol represents four TSV connections 160 respectively connecting each signal line of the four bit wide data bus of a chip to corresponding signal lines of the other chips). It should be noted that the TSV connection reference labels 160*l*, 160*m*, 160*n*, 160*o*, 160*p* and 160*q* of FIG. 10 should not imply these TSV connections are necessarily different from other TSV connections described in this application—they may be the same or different as will be apparent. For example, although TSV connections 160*n* have a different reference label than TSV connections 160*a* and 160*c* described with respect to FIGS. 7 and 8, TSV connections 160*n* may represent TSV connections 160*a* and/or 160*c*.

Figure 11:
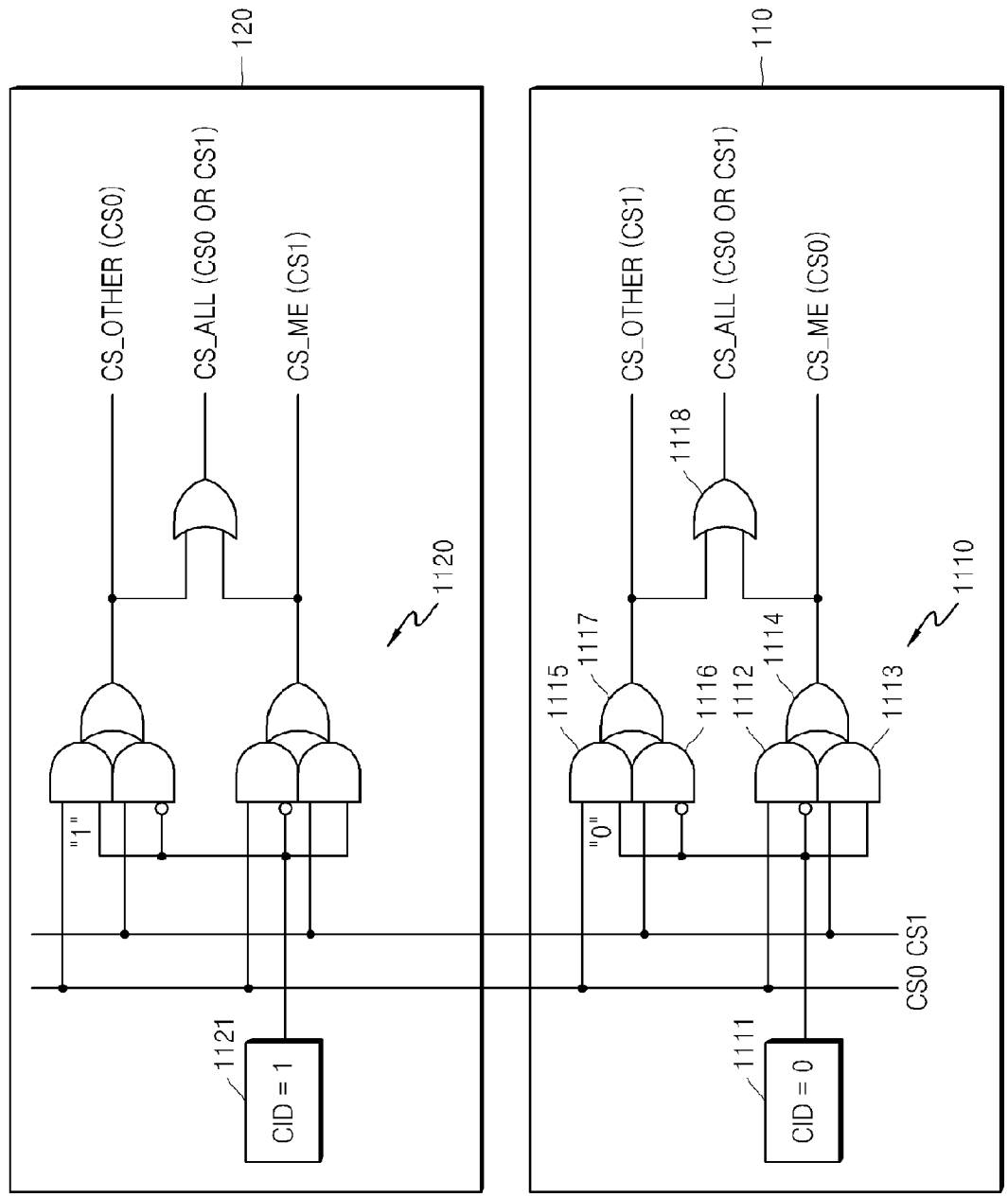
FIG. 11 illustrates global chip selection signal generating circuits for controlling global controlling circuits illustrated in FIG. 10.

FIG. 11 illustrates global chip selection signal generating circuits for controlling the global controlling circuit 1000 illustrated in FIG. 10. For convenience of explanation, FIG. 11 will describe global chip selection signal generating circuits 1110 and 1120 which may be included in the master chip 110 and the first slave chip 120 directly stacked on the master chip 110. The global chip selection signal generating circuit 1110 of the master chip 110 includes a first AND gate 1112 that inputs the inversion of the chip identification signal CID generated in a chip identification fuse unit 1111 of the master chip 110 and the first chip selection signal CS0, a second AND gate 1113 that inputs the chip identification signal CID of the master chip 110 and the second chip selection signal CS1, and a first OR gate 1114 that inputs the outputs of the first and second AND gates 1112 and 1113. In this example, a chip ID of 0 (CID=0) sets the chip to act as a master chip. With the chip ID set to 0, the inverted chip ID input to AND gate 1112 will be set to 1, allowing the CS0 input to AND gate 1112 to pass through AND gate 1112 to OR gate 1114, and the chip ID input to AND gate 1113 will be set to 0, resulting in a 0 output from AND gate 1113. Thus, the logical output of the first OR gate 1114 is the same as CS0 logic. The output of the OR gate 1114 may be treated as the chip select (CS_ME) for the chip. Thus, CS0 may be used to select the master chip 110, having its chip ID CID set to 0. The master chip 110 operates in response to its own chip selection signal CS_ME.

The global chip selection signal generating circuit 1110 of the master chip 110 includes a third AND gate 1115 that inputs the chip identification signal CID and the first chip selection signal CS0, a fourth AND gate 1116 that inputs the inversion signal of the chip identification signal CID of the master chip 110 and the second chip selection signal CS1, and a second OR gate The chip ID of 0 (CID=0) of the master chip 110 results in the inverted chip ID input to AND gate 1116 to be one, allowing CS1 input to AND gate 1116 to pass through AND gate 1116 to OR gate 1117. The chip ID of 0 input to AND gate 1115 resulting in a 0 output from AND gate 1115. Thus, the logical output of OR gate 1117 is the same as the CS1 logic and may be utilized by the master chip 110 to recognize a slave chip access request (CS_OTHER).

The chip selection signal CS_ME and the other chip selection signal CS_OTHER are input to a third OR gate 1118, and an output of the third OR gate 1118 is generated as an all-chip selection signal CS_ALL. The all-chip selection signal CS_ALL is activated when the master chip 110 or the first slave chip 120 is selected. The all chip selection signal CS_ALL may be used to activate the global controlling circuit 1000 illustrated in FIG. 10 when the master chip 110 or the first slave chip 120 operates, so that a read operation in the master chip 110 and the first slave chip 120 may be performed.

In this example, global chip selection signal generating circuit 1120 of the first slave chip 120 has the same structure as that of the global chip selection signal generating circuit 1110 of the master chip 110. The only difference is that the chip identification signal CID of the master chip 110 is set as "0" and the chip identification signal CID of the first slave chip 120 is set as "1". The chip identification signal CID generated in the chip identification fuse unit 1111 of the master chip 110 may be set as logic "0" in the master chip 110. The chip identification signal CID generated in the chip identification fuse unit 1121 of the first slave chip 120 may be set as logic "1" in the first slave chip 120. The chip selection signal CS_ME of the slave chip 120 indicates that the first slave chip 120 has been selected and operates. The other chip selection signal CS_OTHER of the slave chip 120 indicates that a chip other than the first slave chip 120 (here the master chip 110) has been selected. An all-chip selection signal CS_ALL of the first slave chip 120 indicates that a chip other than the slave chip (here, the master chip 110) and/or the first slave chip 120 has been selected. The all-chip selection signal CS_ALL of the first slave chip 120 need not be used. In this example, the chip identification signal CID is generated by a chip identification fuse unit 1111. However, other circuits may be used to generate the chip identification signal CID, such as a mode register set which may be programmed by an external command. The chip identification signal CID may also be generated by state control information. It should also be noted that the chip identification fuse unit 1111 may be programmable, such as by a laser fuse cutting operation, or by an electrical fuse setting operation. In addition, as used in this application, "programmable" as applied to the circuit generating the chip identification signal CID is intended include previously programmable and/or programmed elements even though later modifications to the device may prevent further programming.

Figure 12:
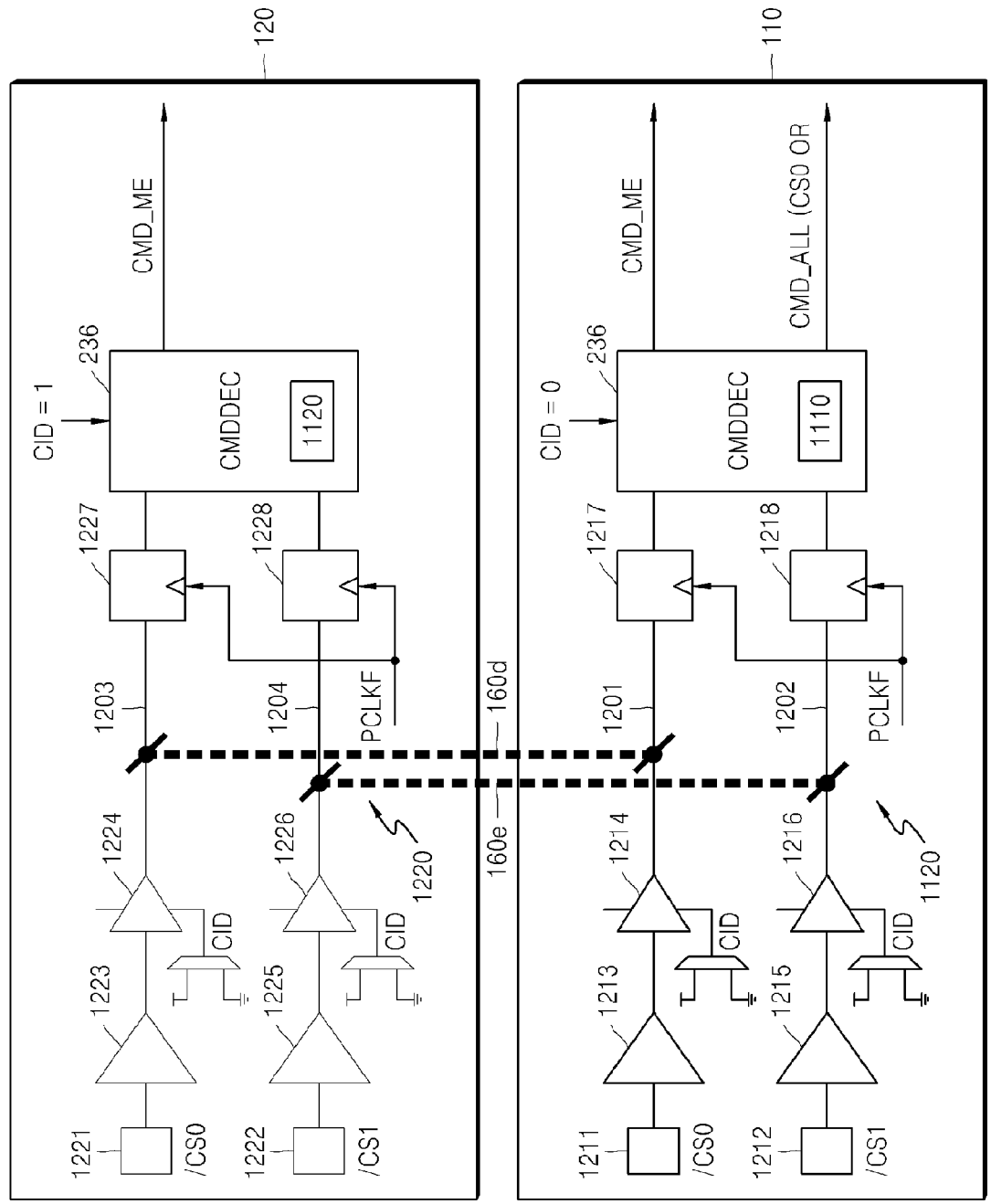
FIG. 12 illustrates a global command generator according to an embodiment.

FIG. 12 illustrates a global command generator according to an embodiment. For convenience of explanation, FIG. 12 will describe global command generating circuits 1210 and 1220 included in the master chip 110 and the first slave chip 120 directly stacked on the master chip 110. The global command generating circuits 1210 and 1220 of the master chip 110 include first and second chip selection signal pads 1211 and 1212, first through fourth buffers 1213, 1214, 1215, and 1216, first and second latches 1217 and 1218, and a command decoder 236.

A first chip selection signal /CS0 input to a first chip selection signal pad 1211 of the master chip 110 is connected to a first signal line 1201 via the first and second buffers 1213 and 1214, and a second chip selection signal /CS1 input to a second chip selection signal pad 1212 of the master chip 110 is connected to a second signal line 1202 via the third and fourth buffers 1215 and 1216. The first chip selection signal /CS0 transmitted to the first signal line 1201 is stored in the first latch 1217 that responds to an internal clock signal PCLKF of the master chip 110 and then is provided to the command decoder CMDDEC 236. The second chip selection signal /CS1 transmitted to the second signal line 1202 is stored in the second latch 1218 that responds to the internal clock signal PCLKF of the master chip 110 and then is provided to the command decoder CMDDEC 236.

The command decoder CMDDEC 236 of the master chip 110 generates its own command signal CMD_ME or an all-command signal CMD_ALL in response to the chip identification signal CID of the master chip 110, a chip select signal /CS0 and a command CMD including read and write commands RD/WR. The command decoder CMDDEC 236 may include the global chip selection signal generating circuit 1110 described with reference to FIG. 11 to generate the CS_ME or CS_ALL signal which may be used to respectively generate or respectively gate (or pass) the a command CMD to CMD_ME and CMD_ALL signal in response to the CS_ME or CS_ALL signal, respectively. If a CS_OTHER signal is to be implemented in the chips 110 and 120 (e.g., as described with respect to FIG. 11, a CMD_OTHER signal may be similarly generated by generating or gating the CMD to generate the CMD_OTHER signal. The command signal CMD_ME indicates that a command that is currently input in response to the chip identification signal CID and the first chip selection signal /CS0 of the master chip 110 is a command for the master chip 110. The master chip 110 enters an operating mode due to its own command signal CMD_ME. The all-command signal CMD_ALL indicates that the currently-input command is a command of the master chip 110 or the first slave chip 120. The all-command signal CMD_ALL is activated when the master chip 110 or the first slave chip 120 is selected. The all-command signal CMD_ALL is used to activate the global controlling circuit 1000 illustrated in FIG. 10 when the master chip 110 or the first slave chip 120 operates, so that a read/write operation the first slave chip 120 may be performed in conjunction with operations of the master chip 110 to complete the read/write operation.

The first chip selection signal /CS0 transmitted to the first signal line 1201 and the second chip selection signal /CS1 transmitted to the second signal line 1202 are connected to the global command generating circuit 1220 of the first slave chip 120 via first and second TSVs 160d and 160e.

The global command generating circuit 1220 of the first slave chip 120 has the same structure as that of the global command generating circuit 1210 of the master chip 110. The global command generating circuit 1220 of the first slave chip 120 receives the first chip selection signal /CS0 transmitted to a third signal line 1203 connected to the first TSV 160d and receives the second chip selection signal /CS1 transmitted to a fourth signal line 1204 connected to the second TSV 160e. In the global command generating circuit 1220 of the first slave chip 120, circuits disposed before the third and fourth signal lines 1203 and 1204 connected to the first and second TSVs 160d and 160e, i.e., first and second chip selection signal pads 1221 and 1222 and first through fourth buffers 1223, 1224, 1225, and 1226 need not be used. The first chip selection signal /CS0 transmitted to the third signal line 1203 is stored in a first latch 1227 that responds to an internal clock signal PCLKF of the first slave chip 120 and then is provided to the command decoder CMDDEC 236 of the first slave chip 120. The second chip selection signal /CS1 transmitted to the fourth signal line 1204 is stored in a second latch 1228 that responds to the internal clock signal PCLKF of the first slave chip 120 and then is provided to the command decoder CMDDEC 236 of the first slave chip 120.

The command decoder CMDDEC 236 of the first slave chip 120 generates its own command signal CMD_ME in response to the chip identification signal CID of the first slave chip 120 and a command CMD including read and write commands RD/WR. The command decoder CMDDEC 236 of the first slave chip 120 includes the global chip selection signal generating circuit 1120 described with reference to FIG. 11. The command signal CMD_ME indicates that a command that is currently input in response to the chip identification signal CID and the second chip selection signal /CS1 of the second slave chip 120 is a command for the first slave chip 120. The first slave chip 120 enters an operating mode due to its own command signal CMD_ME.

The concepts used in the global chip selection signal generating circuits 1110 and 1120 illustrated in FIG. 11 and the global command generating circuit 1220 illustrated in FIG. 12 may be applied to both an on-die-termination (ODT) circuit of the master chip 110 and an ODT circuit of the first slave chip 120. The ODT circuit of the master chip 110 may be activated when the master chip 110 or the first slave chip 120 is selected. The ODT circuit of the first slave chip 120 need not be generated for signals that are received only via TSV connections 160 from the master chip 110. For example, an ODT circuit of the first slave chip 120 connected to a signal line connected to the command pad(s) CMD need not be activated for the first slave chip when command information is received from master chip via TSV connections 160p of FIG. 10 and/or 1302 of FIG. 13.

Figure 13:
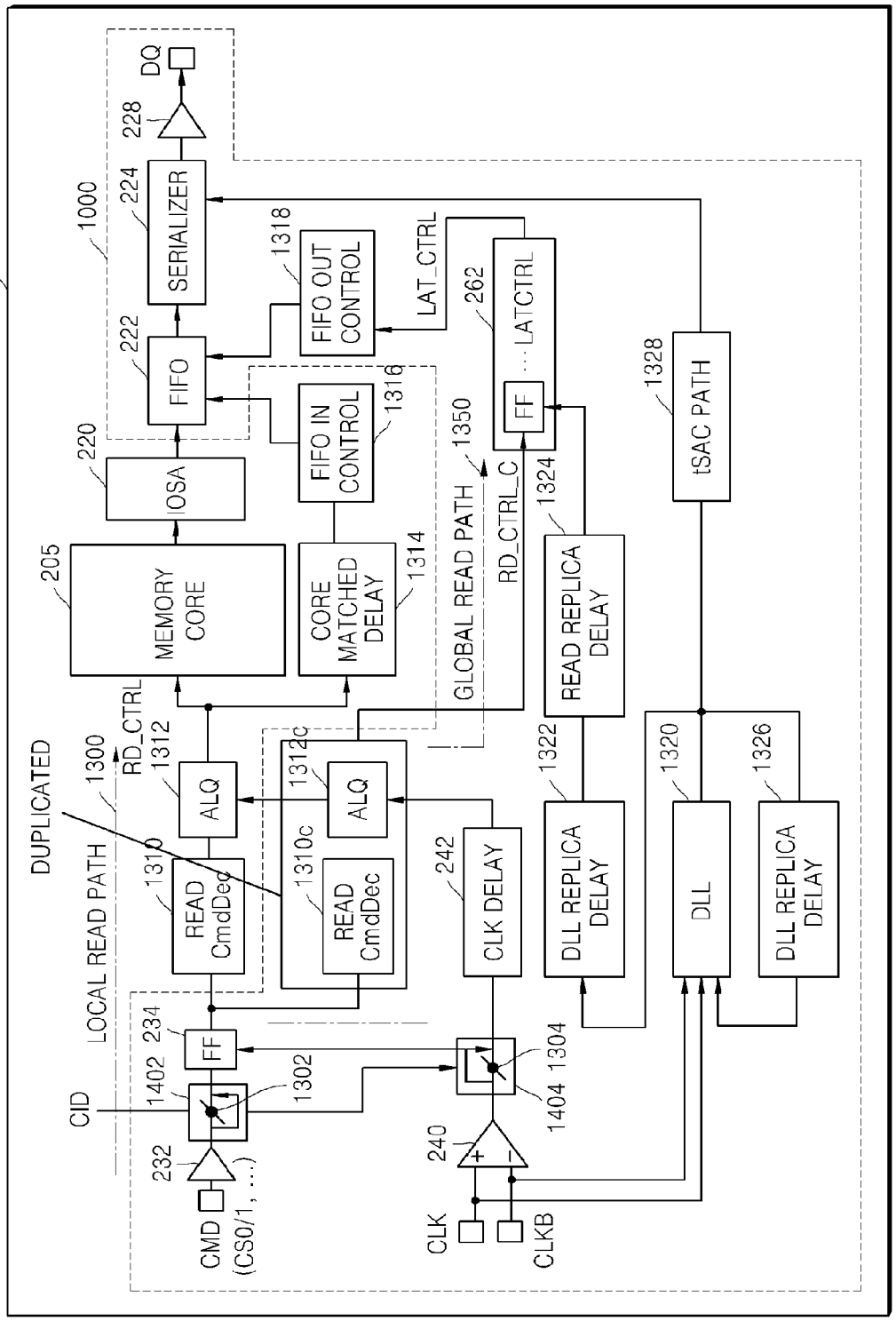
FIG. 13 illustrates a local read control path and a global read control path in a master chip, according to an embodiment.

In the stack of the master chip 110 and first through third slave chips 120, 130, and 140, signals related to command/address/data write/data read may be connected to one another via TSV connections 160. FIG. 13 illustrates a local read control path 1300 and a global read control path 1350 in the master chip 110, according to an embodiment. The local read control path 1300 may be a read control path of the master chip 110, and the global read control path 1350 may be a read control path that involves the first through third slave chips 120, 130, and 140 and that is connected to the master chip 110 via the TSV connections 160.

The local read control path 1300 includes the command input buffer 232 that receives the command CMD, the flip flop FF 234, a read command decoder 1310, and an additive latency shifter register ALQ 1312, and a read control signal RD_CTRL is generated in the local read control path 1300. Data stored in the memory cell array block MEMORY CORE 205 is transmitted to the data input/output driver IOSA 220 in response to the read control signal RD_CTRL and is output to the read FIFO 222, the serializer SER 224, the data output buffer 228, and the data input/output pad DQ. The local read control path 1300 of the master chip 110 is activated in response to the first chip selection signal CS0 of the master chip 110.

The global read control path 1350 includes the command input buffer 232 that receives the command CMD, the flip flop FF 234, a read command decoder replica circuit READ CmdDec 1310c, and an additive latency shifter register replica circuit ALQ 1312c, and a duplicated read control signal RD_CTRL_C is generated in the global read control path 1350. The additive latency shifter register ALQ 1312 and the additive latency shifter register replica circuit ALQ 1312c are controlled by the clock input buffer 240 that receives clock signals CLK and CLKB and a clock buffer circuit CLK DELAY 242. The duplicated read control signal RD_CTRL_C is supplied to the latency controller 262 and a FIFO output controller 1318 and is used to control the read FIFO 222. Data stored in the memory cell array block MEMORY CORE 205 or data output from the first through third slave chips 120, 130, and 140 are transmitted to the read FIFO 222. The data transmitted to the read FIFO 222 are output to the serializer SER 224, the output buffer 228, and the data input/output pad DQ.

The read FIFO 222 is controlled by the FIFO output controller 1318 that responds a latency control signal LAT_CTRL generated in the latency controller 262. The latency controller 262 generates the latency control signal LAT_CTRL in response to the duplicated read control signal RD_CTRL_C and an internal clock signal I_CLK. The duplicated read control signal RD_CTRL_C is generated on the global read control path 1350 including the command input buffer 232 that receives commands CMDs, the flip flop FF 234, the read command decoder replica circuit READ Cmd-Dec 1310c, and the additive latency shifter register replica circuit ALQ 1312c. The internal clock signal I_CLK is generated by the clock input buffer 240 that receives the clock signals CLK and CLKB, a DLL 1320 a first DLL replica delay circuit 1322, and a read replica delay circuit 1324. First and second DLL replica delay circuits 1322 and 1326 are blocks that duplicate the DLL 1320 and are used to indicate an operating delay time of the DLL 1320. The read replica delay circuit 1324 compensates for a delay on a path on which an output clock signal of a DLL 1320 is applied to the serializer SER 224, i.e., a delay on a clock output path tSAC PATH 1328.

The global controlling circuit 1000 illustrated in FIG. 10 may be implemented as shown in FIG. 13. In particular, global read control-related circuits include the command input buffer 232, the flip flop 234, the read command decoder READ CmdDec 1310, the additive latency shifter register ALQ 1312, the read command decoder READ CmdDec 1310c, the additive latency shifter register replica circuit ALQ 1312c, the clock input buffer 240, the clock buffer 242, the DLL 1320, the first and second DLL replica delay circuits 1322 and 1326, the read replica delay circuit 1324, the clock output path tSAC PATH 1328, the read FIFO 222, the serializer SER 224, the data output buffer 228, and the data input/output pad DQ. The global controlling circuit 1000 is activated in response to the first chip selection signal CS0 of the master chip 110 or the second chip selection signal CS1 of the first slave chip 120.

The latency controller 262 generally includes a plurality of serially-connected flip flops. A first flip flop of the latency controller 262 receives the read control signal RD_CTRL_C and the internal clock signal I_CLK and guarantees a margin therebetween. In order to guarantee the margin between the read control signal RD_CTRL_C and the internal clock signal I_CLK regardless of a variation (PVT variation) in a semiconductor manufacturing process, a voltage, a temperature or the like, the internal clock signal I_CLK is generated by the first DLL replica delay circuit 1322 and the read replica delay circuit 1324.

When the command CMD and the clock signals CLK and CLKB are transmitted on a signal line and to which TSVs 1302 and 1304 connected between the master chip 110 and the first through third slave chips 120, 130, and 140, the command CMD and the clock signals CLK and CLKB experience a load between the TSVs 1302 and 1304 in both the master chip 110 and the first through third slave chips 120, 130, and 140. However, the clock signals CLK and CLKB transmitted to the DLL 1320 do not experience the load between the TSVs 1302 and 1304. The read control signal RD_CTRL_C is supplied to the latency controller 262 with a delay time due to the load between the TSVs 1302 and 1304, for example, with a delay skew of about 500 ps, compared to the clock internal signal I_CLK. Thus, there is a problem in that a margin between the read control signal RD_CTRL_C and the internal clock signal I_CLK may be reduced in the first flip flop of the latency controller 262.

Thus, the command CMD and the clock signals CLK and CLKB of the master chip 110 do not experience the load of the TSVs 1302 and 1304 by bypassing the TSVs 1302 and 1304. The signal path of the command CMD received by the command buffer and command decoder CMDDEC CMDQ 236 of master chip 110 may not include any connections to TSV connections to the slave chip(s), such as TSV connection 1302. Similarly, the signal path of clock signals CLK and CLKB received by DLL 1320 of the of the master chip 110 may not include any connection to TSV connections to the slave chip(s), such as TSV connections 1304. In contrast, the commands CMDs and the clock signals CLK and CLKB of the first through third slave chips 120, 130, and 140 may pass through the TSVs 1302 and 1304.

Figure 14:
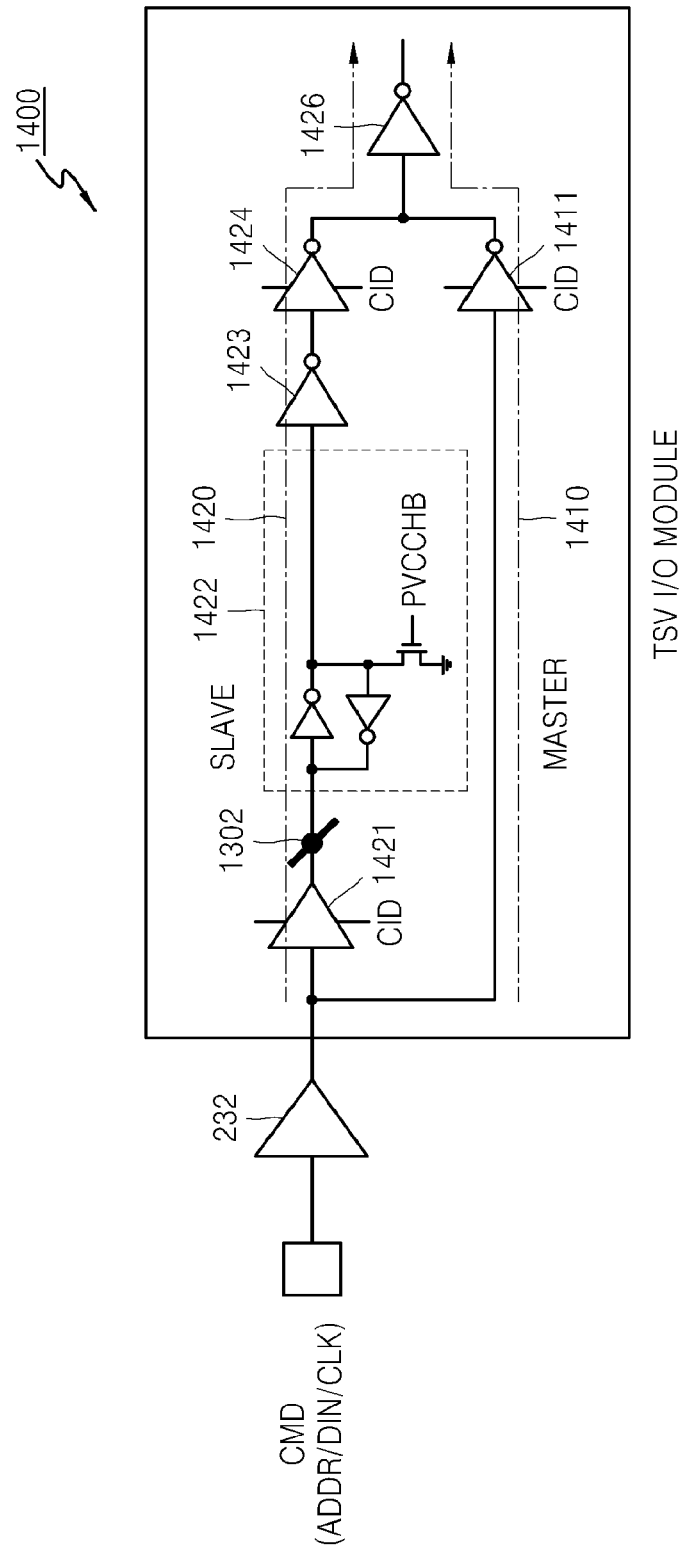
FIG. 14 illustrates a TSV input/output (I/O) module that is designed in such a way that a path of a master chip and paths of slave chips may be different from each other, according to an embodiment.

FIG. 14 illustrates an example of TSV input/output (I/O) module 1400, which may be either module 1402 or 1404 of FIG. 13. TSV input/output module 1400 may allow a path of the master chip 110 and a path of the first through third slave chips 120, 130, and 140 to be different from each other, according to an embodiment. TSV input/output module 1400 will be described in connection with its implementation by module 1402 in FIG. 13. Implementation of module 1400 by module 1404 will be understood with reference to this description and FIG. 13. The TSV I/O module 1400 illustrated in FIG. 14 includes a region of the TSV 1302 illustrated in FIG. 13 and is included in the master chip 110 and the first through third slave chips 120, 130, and 140.

Referring to FIG. 14, the TSV I/O module 1400 includes a first path 1410 and a second path 1420 that receives a command CMD transmitted through the command input buffer 232. The first path 1410 includes a first inverter 1411 that responds to the chip identification signal CID. The second path 1420 includes a buffer 1421 that responds to the chip identification signal CID, a latch 1422 connected to an output of the buffer 1421 and the TSV 1302, a second inverter 1423 that inputs an output of the latch 1422, and a third inverter 1424 that inputs an output of the second inverter 1423 in response to the chip identification signal CID. An output of the first inverter 1411 and an output of the third inverter 1424 are input to a fourth inverter 1426. When the module 1402 of FIG. 13 is implemented as module 1400 of FIG. 14, an output of the fifth inverter 1426 is provided to the flip flop FF 234 illustrated in FIG. 13. When the module 1404 of FIG. 13 is implemented as module 1400 of FIG. 14, an output of the fifth inverter 1426 is provided to clock generator and buffer CLK 242 illustrated in FIG. 13.

The master chip 110 receives the command CMD via the first path 1410 of the TSV I/O module 1402 in response to the chip identification signal CID of the master chip 110, for example, "0". For example, the first slave chip 120 among the first through third slave chips 120, 130, and 140 receives the command CMD via the second path 1420 of the TSV I/O module 1402 in response to the chip identification signal CID of the first slave chip 120, for example, "1". The command CMD of the master chip 110 does not pass through the TSV connection 1302 and thus does not experience a TSV load. The command CMD of the first slave chip 120 passes through the TSV connection 1302 and thus experiences a TSV load. In the current embodiment, the TSV I/O module 1402 that receives the command CMD has been described. However, the TSV I/O module is also applicable for receiving address/data input/clock signal ADD/DIN/CLK signals, such as supplementing TSV connections 160l, 160m, 160o and 160q of FIG. 10 (e.g., use of TSV I/O module 1400 after buffers 210, 226, 240, and/230 of FIG. 10, where TSV connections 160l, 160m, 160o and/or 160q of FIG. 10 would represent TSV connection 1302 of module 1400). In this case, the address, data input and/or clock signal ADD/DIN/CLK of the master chip 110 is input via the first path 1410 and does not have the TSV load, and the address, data input and/or clock signal ADDR/DIN/CLK of the first through third slave chips 120, 130, and 140 is input via the second path 1420 and has the TSV load.

Figure 15A:
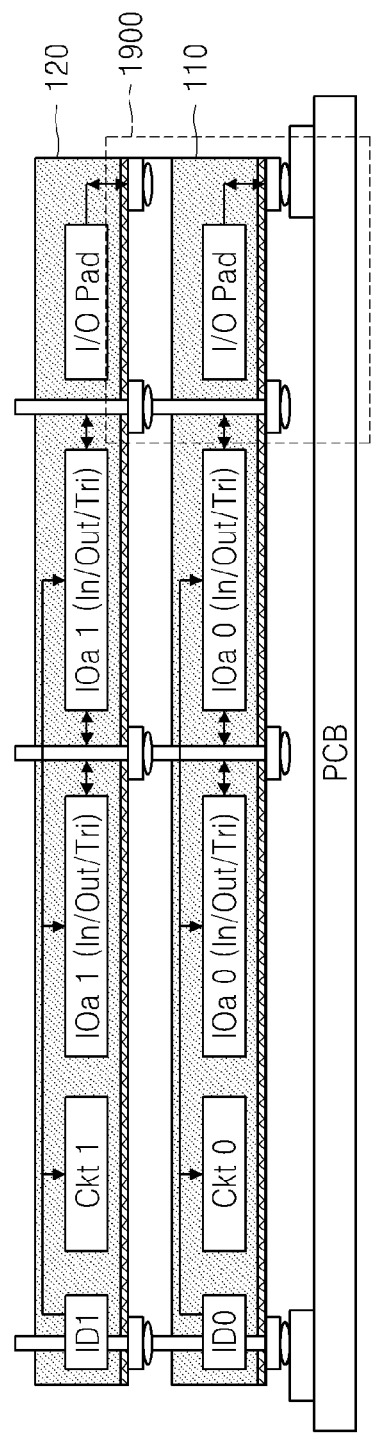
FIGS. 15A and 15B respectively illustrate logic circuits including different elements that conform to their design purposes according to layers in chips having circuits having the same physical properties, according to an embodiment.
Figure 15B:
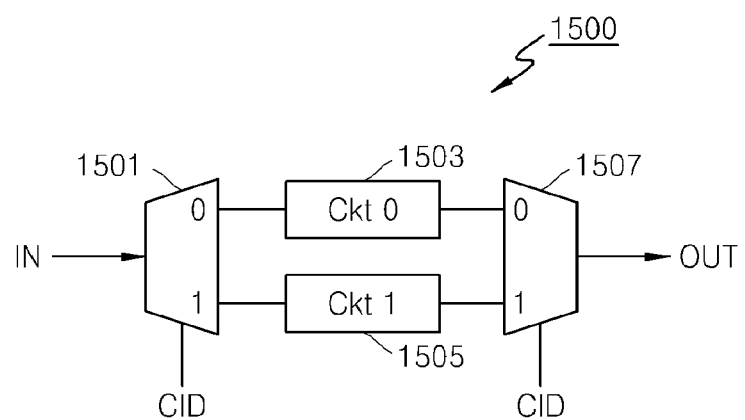

When a 3D device in which a plurality of chips are stacked requires a different circuit configurations according to a layer of the chip, wafer and/or chip management according to layers is necessary, which causes a drawback in productivity. FIGS. 15A and 15B respectively illustrate logic circuits including different elements that conform to their design purposes according to layers in chips having circuits having the same physical properties, according to an embodiment. When physically-identical chips are assembled and are powered-up after being assembled and the chips are electrically and automatically differentiated from one another, as illustrated in FIG. 15A, a 3D device having a different circuit configuration according to layers may be implemented.

Elements for implementing the 3D device having a different circuit configuration according to layers include a circuit for electrically applying the chip identification signal CID and a circuit for electrically differentiating a configuration circuit, an I/O type or the like, according to layers, by receiving the chip identification signal CID. The circuit for electrically applying the chip identification signal CID may use the counter 700. A logic circuit 1500 having different elements that conform to their design purposes according to layers by receiving the chip identification signal CID in chips having the same circuit in all layers is illustrated in FIG. 15B.

Referring to FIG. 15B, the logic circuit 1500 is present in both the master chip 110 and the first slave chip 120. The logic circuit 1500 includes DEMUX circuit 1501 that receives an input signal IN, first and second circuits 1503 and 1505, and MUX circuit 1507 that outputs an output signal OUT. The DEMUX circuit 1501 optionally transmits the input signal IN to the first circuit 1503 or the second circuit 1505 in response to the chip identification signal CID. The first circuit 1503 and the second circuit 1505 have a different circuit configuration. The MUX circuit 1507 optionally transmits an output of the first circuit 1503 or an output of the second circuit 1505 as the output signal OUT in response to the chip identification signal CID.

It is assumed that the chip identification signal CID of the master chip 110 is "0", for example, and the chip identification signal CID of the first slave chip 120 is "1", for example. The logic circuit 1500 of the master chip 110 transmits the input signal IN to the first circuit 1503 via the DEMUX circuit 1501 in response to the chip identification signal CID "0" of the master chip 110 and outputs the output of the first circuit 1503 as the output signal OUT via the MUX circuit 1507. The logic circuit 1500 of the first slave chip 120 transmits the input signal IN to the second circuit 1505 via the DEMUX circuit 1501 in response to the chip identification signal CID "1" of the first slave chip 120 and outputs the output of the second circuit 1505 as the output signal OUT via the MUX circuit 1507. Thus, in the master chip 110 and the first slave chip 120 having the same logic circuit 1500, the master chip 110 is constituted as the first circuit 1503, and the first slave chip 120 is constituted as the second circuit 1505.

In chips having the same circuit in all layers, a logic circuit generates a chip selection signal used to activate the chips and generates a global chip selection signal in response to the chip selection signal. The logic circuit may be explained as the global chip selection signal generating circuits 1110 and 1120 that are respectively included in the master chip 110 and the first slave chip 120 illustrated in FIG. 11. In detail, the global chip selection signal generating circuits 1110 and 1120 activate the all-chip selection signal CS_ALL of the master chip 110 when the master chip 110 or the first slave chip 120 is selected, to activate the global controlling circuit 1000 (see FIG. 10) of the master chip 110, which is shared by the master chip 110 and the first slave chip 120. The global chip selection signal generating circuits 1110 and 1120 activate their own chip selection signal CS_ME of the master chip 110 when only the master chip 110 is selected, to activate the master chip 110 and activate the chip selection signal CS_ME of the first slave chip 120 when only the first slave chip 120 is selected, to activate the first slave chip 120.

Figure 16:
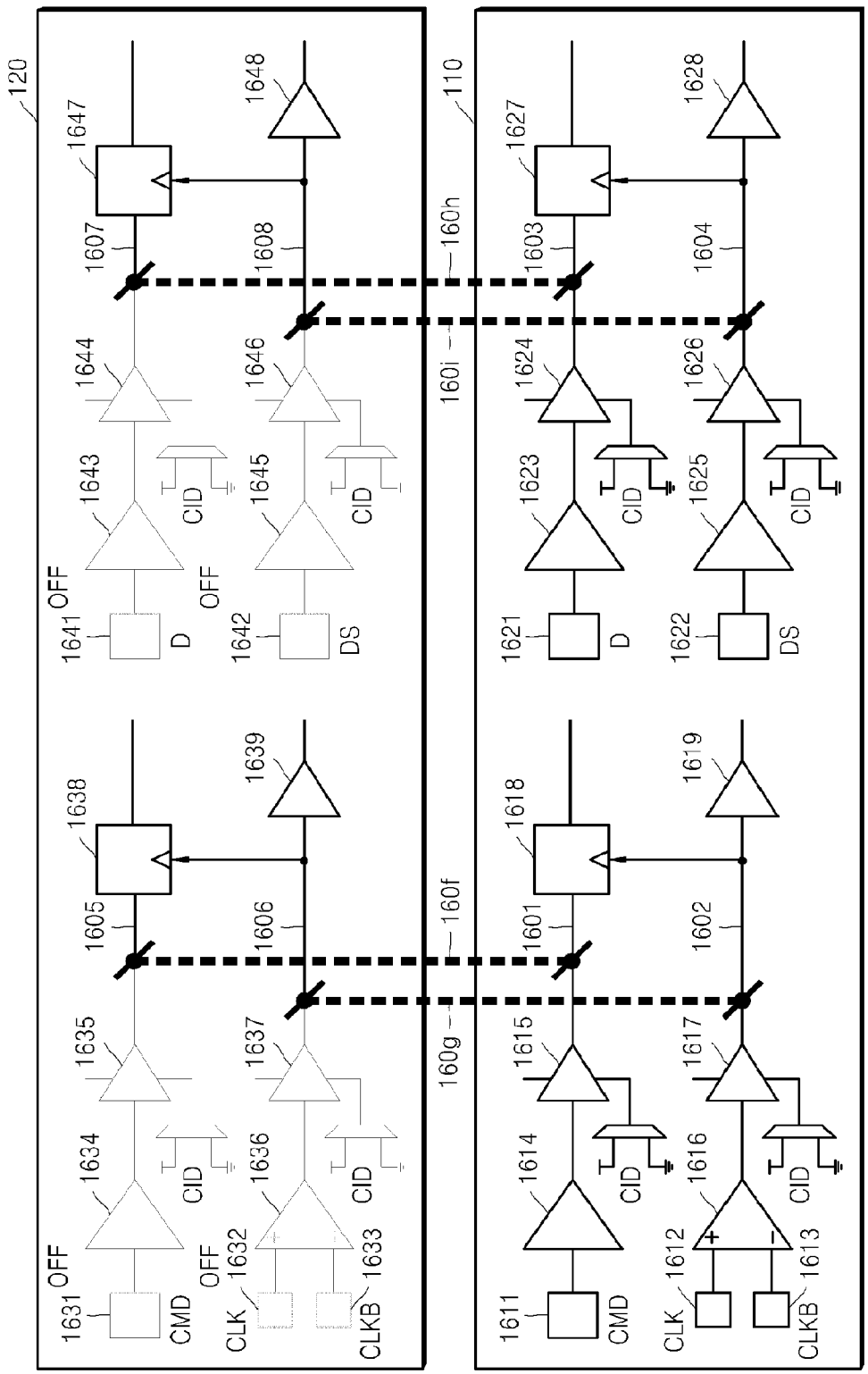
FIG. 16 illustrates an Electrical Die Sort (EDS) level test path and a package level test path in a structure in which a master chip and a first slave chip are stacked, according to an embodiment.

In a 3D device in which chips having the same circuit in all layers are stacked, a circuit block used in a wafer level test and a circuit block used in a package level test need to be differentiated from each other. FIG. 16 illustrates an Electrical Die Sort (EDS) level test path and a package level test path in a structure in which the master chip 110 and the first slave chip 120 are stacked, according to an embodiment. The Electrical Die Sort (EDS) level test may comprise testing individual chips or dies prior to combination in a package. The individual dies may be tested with the EDS level test when integral with a wafer or after being singulated (cut) from the wafer (whether as separated completely form all other dies of the wafer, or integrally formed with one or more other dies of the wafer). A package level test may comprise testing a package including master chip 110 and slave chip 120 stacked with master chip 110. For example, the package may include a protective packaging material protecting the master chip 110, the first slave chip 120 and other chips of the package (e.g., additional slave chips, such as those of FIG. 10).

Referring to FIG. 16, the EDS level test path and the package level test path of the master chip 110 may include a command path, a clock path, a data path, and a data strobe signal path. The EDS level test path and the package level test path of the master chip 110 are the same. The command path of the master chip 110 includes a command pad 1611 that receives a command CMD, an input buffer 1614 that inputs the command CMD, a driver 1615 that transmits the command CMD to a first signal line 1601 in response to a chip selection signal CID, and a latch circuit 1618 that latches the command CMD of the first signal line 1601 in response to a clock signal CLK of the second signal line 1602.

The clock path of the master chip 110 includes a clock input buffer 1616 that inputs the clock signals CLK and CLKB received by clock pads 1612 and 1613 and outputs a clock signal CLK, a driver 1617 that transmits the clock signal CLK to the second signal line 1602 in response to the chip identification signal CID, and a buffer 1619 that transmits the clock signal of the second signal line 1602 to an internal circuit.

The data path of the master chip 110 includes a data pad 1621 that receives data D, a data input buffer 1623 that inputs the data D, a driver 1624 that transmits the data D to a third signal line 1603 in response to the chip identification signal CID, and a latch 1627 that latches the data D of the third signal line 1603 in response to a data strobe signal DS of a fourth signal line 1603.

The data strobe signal path of the master chip 110 includes an input buffer 1625 that inputs a data strobe signal DS received by a data strobe signal pad 1622, a driver 1626 that transmits the data strobe signal DS to a fourth signal line 1604 in response to the chip identification signal CID, and a buffer 1628 that transmits the data strobe signal DS of the fourth signal line 1604 to an internal circuit.

The first slave chip 120 has the same circuit configuration as the command path, the clock path, the data path, and the data strobe signal path of the master chip 110. The EDS level test path and the package level test path of the first slave chip 120 are different from each other.

Like the EDS level test path of the master chip 110, the EDS level test path of the first slave chip 120 includes a command path including a command pad 1631, an input buffer 1634, a driver 1635, a fifth signal line 1605, and a latch 1638, a clock path including clock pads CLK and CLKB, a clock input buffer 1636, a driver 1637, a sixth signal line 1606, and a buffer 1639, a data path including a data pad 1641, a data input buffer 1643, a driver 1644, a seventh signal line 1607, and a latch 1647, and a data strobe signal path including a data strobe signal pad 1643, an input buffer 1645, a driver 1646, an eighth signal line 1608, and a buffer 1648. The EDS level test path of the first slave chip 120 is formed in response to the chip identification signal CID of the first slave chip 120.

The package level test of the first slave chip 120 uses the command path, the clock path, the data path, and the data strobe signal path of the master chip 110. The command CMD, the clock signal CLK, the data D, and the data strobe signal DS are received from the master chip 110 via TSVs 160f, 160g, 160h, and 160i. The device illustrated in FIG. 10 of this application may implement the detailed circuitry of FIG. 16, and TSV connections 160f, 160g, 160h and 160i may be TSV connections 160o, 160p, 160l, and 160m, respectively. The fifth signal line 1605 of the first slave chip 120 is connected to the first signal line 1601 of the master chip 110 via the TSV connection 160f and receives the command CMD transmitted to the first signal line 1601 via the command path of the master chip 110. The sixth signal line 1606 of the first slave chip 120 is connected to the second signal line 1602 of the master chip 110 via the TSV connection 160g and receives the clock signal CLK transmitted to the second signal line 1602 via the clock path of the master chip 110. The seventh signal line 1607 of the first slave chip 120 is connected to the third signal line 1603 of the master chip 110 via the TSV connection 160h and receives the data D transmitted to the third signal line 1603 via the data path of the master chip 110. The eighth signal line 1608 of the first slave chip 120 is connected to the fourth signal line 1603 of the master chip 110 via the TSV connection 160i and receives the data strobe signal DS transmitted to the fourth signal line 1604 via the data strobe signal path of the master chip 110.

A package level test may comprise testing a package including master chip 110 and slave chip 120 stacked with master chip 110. When the package level test of the first slave chip 120 is performed, the latch 1638 of the slave chip 120 is used in the command path of the first slave chip 120, and the command pad 1631, the input buffer 1634, and the driver 1635 of the slave chip are not used during the package level test. The latch 1638 latches the command CMD transmitted to the fifth signal line 1605 from the first signal line 1601 of the master chip 110 via the TSV 160f in response to the clock signal CLK transmitted to the sixth signal line 1605 from the second signal line 1602 of the master chip 110 via the TSV 160g. The buffer 1639 is used in the clock path of the first slave chip 120 during the package level test of the first slave chip 120, and the clock pads CLK and CLKB, the clock input buffer 1636, and the driver 1637 of the slave chip 120 are not used during the package level test. The buffer 1639 receives the clock signal CLK transmitted to the sixth signal line 1605 from the second signal line 1602 of the master chip 110 via the TSV 160g. The latch 1647 is used in the data path of the first slave chip 120 during the package level test, and the data pad 1641, the data input buffer 1643, and the driver 1644 are not used during the package level test. The latch 1647 latches the data D transmitted to the seventh signal line 1607 from the third signal line 1603 of the master chip 110 via the TSV 160h in response to the data strobe signal DS transmitted to the eighth signal line 1608 from the fourth signal line 1604 of the master chip 110 via the TSV 160i. The buffer 1648 is used in the data strobe path of the first slave chip 120 during the package level test, and the data strobe signal pad 1642, the input buffer 1645, and the driver 1646 are not used during the package level test. The buffer 1648 receives the data strobe signal DS transmitted to the eighth signal line 1608 from the fourth signal line 1604 of the master chip 110 via the TSV 160i.

Figure 17:
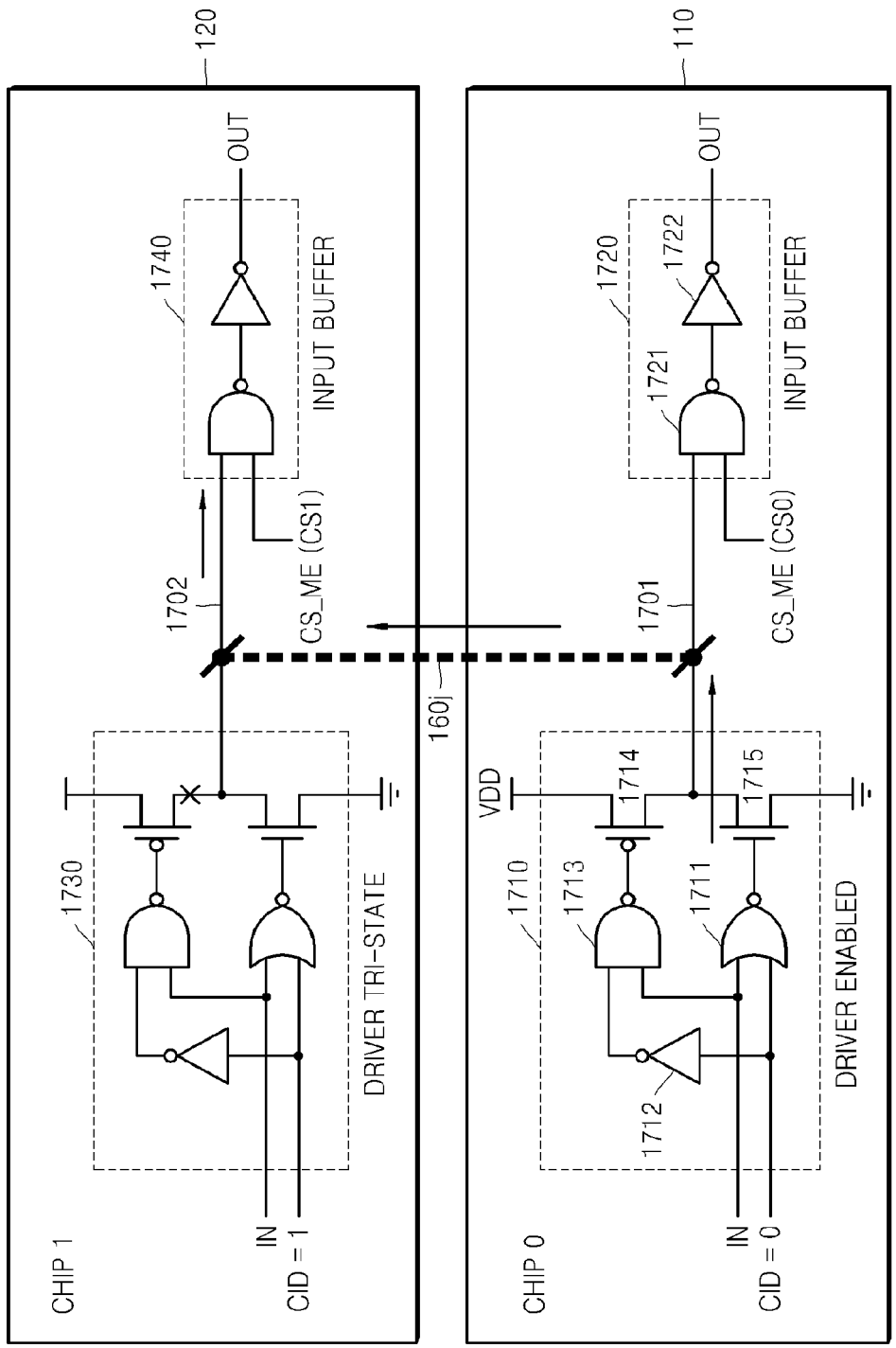
FIGS. 17 and 18 respectively illustrate logic circuits including different I/O types, i.e., input/output/tri-state, that conform to their design purposes according to layers in chips having circuits having the same physical properties, according to an embodiment.

In a 3D device in which chips having the same circuit in all layers are stacked, I/O types need to be differentiated from one another according to layers. FIG. 17 illustrates a logic circuit including different I/O types, e.g., input/output/tri-state, that conform to their design purposes according to layers in chips having circuits having the same physical properties by receiving the chip identification signal CID, according to an embodiment.

In the structure illustrated in FIG. 17 in which the master chip 110 and the first slave chip 120 are stacked, each of the master chip 110 and the first slave chip 120 includes drivers 1710 and 1730 and input buffers 1720 and 1740 that receive the input signal IN and output the output signal OUT. The driver 1710 of the master chip 110 may have the same structure as the driver 1730 of the first slave chip 120, and the input buffer 1720 of the master chip 110 may have the same structure as the input buffer 1740 of the first slave chip 120.

The driver 1710 of the master chip 110 includes a NOR gate 1711 that inputs the input signal IN input to the master chip 110 and inputs the chip identification signal CID of the master chip 110, an inverter 1712 that inputs the chip identification signal CID of the master chip 110, a NAND gate 1713 that inputs the input signal IN and an output of the inverter 1712, and a PMOS transistor 1714 and an NMOS transistor 1715 that are serially connected between a power supply voltage VDD and a ground voltage VSS. A gate of the PMOS transistor 1714 is connected to an output of the NAND gate 1713, and a gate of the NMOS transistor 1715 is connected to an output of the NOR gate 1711. A connection node between the PMOS transistor 1714 and the NMOS transistor 1715 that will be an output of the driver 1710 of the master chip 110 is connected to a first signal line 1701.

The input buffer 1720 of the master chip 110 includes a NAND gate 1721 that inputs the output of the driver 1710 and the chip identification signal CID, and an inverter 1722 that inputs an output of the NAND gate 1721. The driver 1730 and the input buffer 1740 of the first slave chip 120 operate in response to the input signal IN input to the first slave chip 120 and the chip identification signal CID of the first slave chip 120. A second signal line 1702 to which an output of the driver 1730 of the first slave chip 120 is connected, is connected to the first signal line 1701 of the master chip 110 via a TSV connection 160j.

The chip identification signal CID of the master chip 110 is set as "0", for example, and the chip identification signal CID of the first slave chip 120 is set as "1", for example. Thus, the driver 1710 of the master chip 110 is enabled and provides an output of the input signal IN on signal line 1701. The driver 1730 of the first slave chip 120 is disabled and tri-stated (e.g., providing a high impedance at its output). When CS_ME of the master chip 110 is active to indicate selection of the master chip 110, input buffer 1720 is enabled. When CS_ME of the master chip 110 is inactive, indicating the master chip 110 has not been selected, input buffer 1720 of master chip 110 is inactive. Similarly, when CS_ME of the slave chip 120 is active to indicate selection of the slave chip 120, input buffer 1740 of the slave chip 120 is enabled. When CS_ME of the slave chip 120 is inactive, indicating the slave chip 110 has not been selected, input buffer 1740 is inactive. When the slave chip 120 has been selected (e.g., CS_ME of the slave chip 120 is active), input signal IN input to the master chip 110 is transmitted via a path including the driver 1710 and the first signal line 1701 of the master chip 110, the TSV 160j, and the second signal line 1702 and the input buffer 1740 of the first slave chip 120. Thus, the master chip 110 operates as a driver, and the first slave chip 120 operates as a receiver.

The structure of FIG. 17 may be implemented by the embodiment shown in FIG. 16. Drivers 1615, 1617, 1624, 1626, 1635, 1637, 1644 and 1646 may include the structure and corresponding inputs of tri-state driver 1710/1730. Buffers 1619, 1628, 1637 and 1648 of FIG. 16 may implement the structure and corresponding inputs of input buffer 1720/1740.

Figure 18:
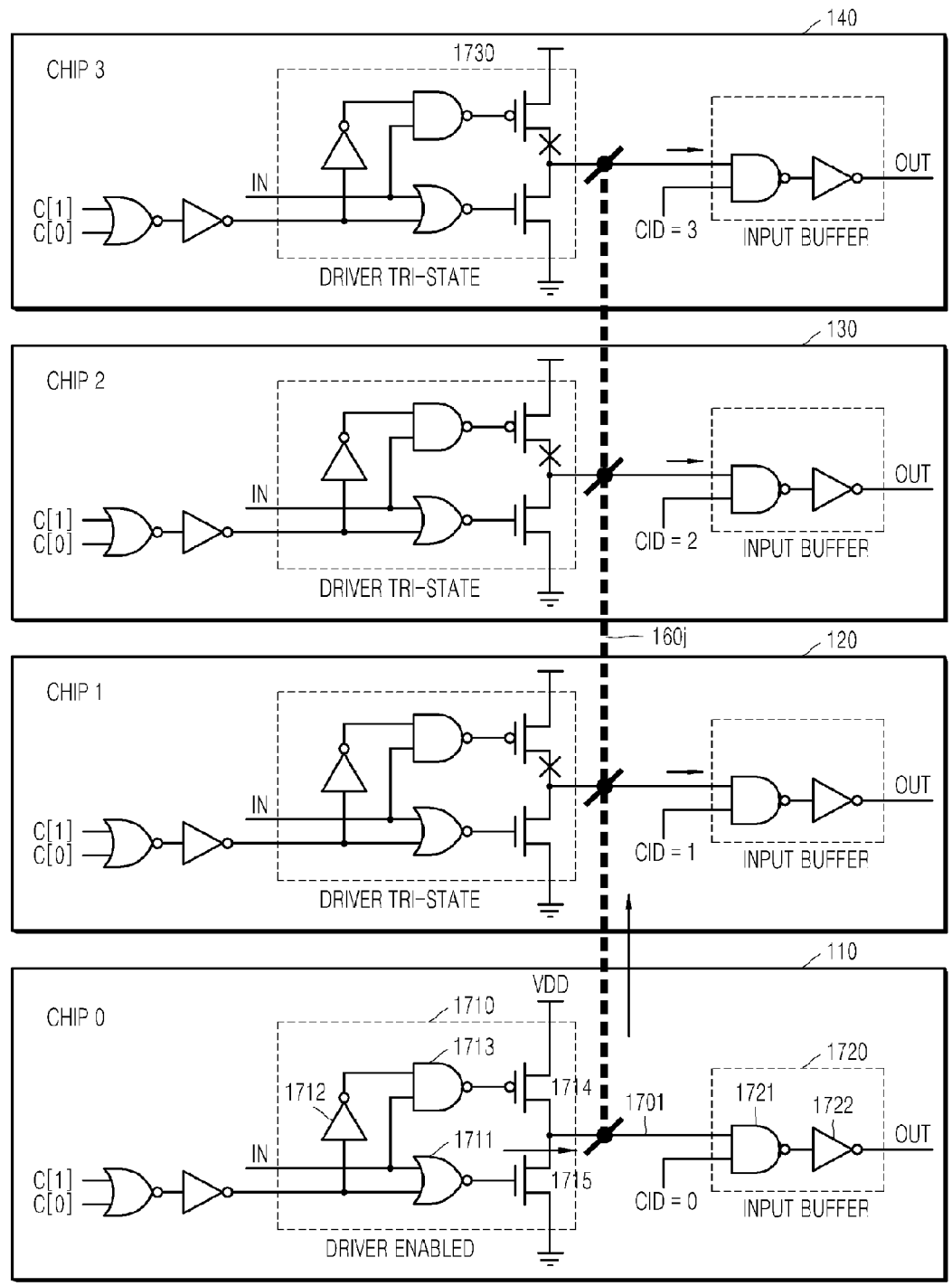

FIG. 17 illustrates a 3D device including the master chip 110 and the first slave chip 120. The structure of FIG. 17 may be implemented in a 3D device having only two layers (i.e., the master chip 110 and the slave chip 120). However, the invention is not limited to only two layers and may include more than two layers. The 3D device having the two-layer structure may be extended as a 3D device having a four-layer or an eight-layer structure. FIG. 18 illustrates a 3D device having a four-layer structure in which the master chip 110 and the first through fourth slave chips 120, 130, and 140 are stacked.

Referring to FIG. 18, the chip identification signal CID of the master chip 110 and each of the chip identification signals CID of the first through third slave chips 120, 130, and 140 are constituted with a combination of first and second code signals C[1:0]. The chip identification signal CID of the master chip 110 is set as "00" that is, a combination of the first and second code signals C[1:0], and each of the chip identification signals CID of each of the first through third slave chips 120, 130, and 140 is respectively set as "01", "10", and "11," combinations of the first and second code signals C[1:0]. Thus, the master chip 110 operates as a driver in response to the combination "00" of the first and second code signals C[1:0], and each of the first through third slave chips 120, 130, and 140 operates as a receiver.

Likewise, in the case of a 3D device having an eight-layer structure, the chip identification signal CID of each of the master chip 110 and first through seventh slave chips may constitute a combination of first through third code signals C[2:0]. The chip identification signal CID of the master chip 110 may be set as "000" that is a combination of the first through third code signals C[2:0], and each chip identification signal CID of the first through seventh slave chips may be respectively set as "001", "010", "011", "100", "101", "110", and "111". The master chip 110 may operate as a driver in response to the combination of the first through third code signals C[2:0], and each of the first through third slave chips 120, 130, and 140 may operate as a receiver.

Referring back to FIGS. 15A and 15B, positions, sizes, and thicknesses of bumps on a chip package as well as a chip layout may be identical. The stacked chips 110 and 120 may have the same physical properties and be manufactured according to the same circuit design. In FIG. 15, as the master chip 110 and the first slave chip 120 are stacked, and a bump connected to a TSV pad of the first slave chip 120 contacts a TSV protrusion of the master chip 110. To prevent the bump connected to the TSV pad of the first slave chip 120 contacting a backside of the master chip 110 and creating an undesired short circuit, a element for preventing a bump-to-wafer backside short-circuit is necessary.

Figure 19:
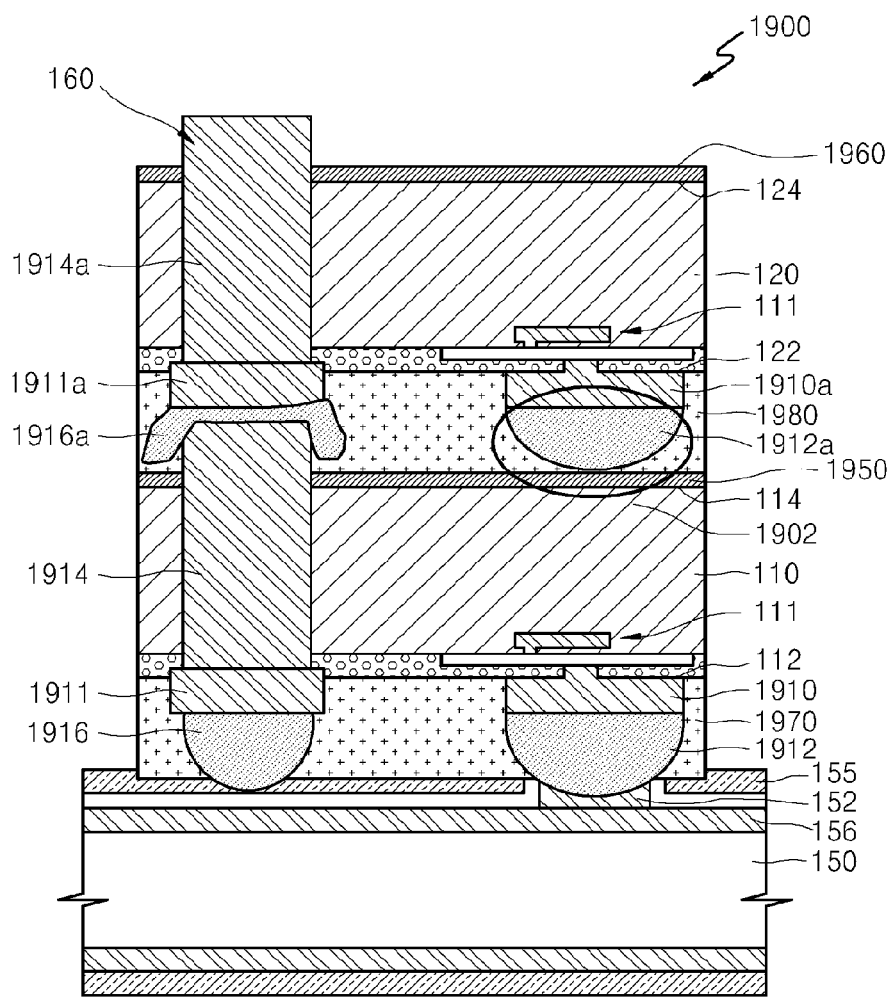
FIG. 19 illustrates a TSV-to-bump air connection method that prevents a bump-to-wafer backside short-circuit, according to an embodiment.

FIG. 19 illustrates a TSV connection 160 and associated method that may reduce a likelihood of a bump-to-wafer backside short-circuit, according to an embodiment. FIG. 19 may be implemented by the embodiment of FIG. 15 and represent area labeled 1900 in FIG. 15. Referring to FIG. 19, an electrode pad 1910 and a TSV pad 1911 are formed on a first surface 112 of the master chip 110. The electrode pad 1910 is connected to circuit patterns formed over the first surface 112 of the master chip 110, and the TSV pad 1911 is connected to a TSV 1914 that is formed through the master chip 110. Bumps 1912 and 1916 contact the electrode pad 1910 and the TSV pad 1911, respectively. The TSV 1914 protrudes from a second surface 114 of the master chip 110. The bump 1912 connected to the electrode pad 1910 contacts an electrode 152 of a PCB substrate 150, which may contact a wiring layer 156 of the PCB substrate 150. Bump 1916 may not be connected or not directly connected to PCB substrate 150. For example, bump 1916 may terminate at an air gap or may be separated from wiring layer 156 of the PCB substrate 150 by an insulating material 155. The PCB substrate 150 may constitute a package substrate of a package in which master chip 110 and slave chip 120 are packaged, for example, encased in a protective molding material. Underfill material 1970 may be formed between first surface 112 of master chip 110 and a top surface of the PCB substrate 150. The underfill material 1970 may encase solder bumps 1912 and 1916 to assist in reducing defects, such as cracking of the solder bumps. Rather than underfill material, element 1970 may be air, such that an air gap is formed between the PCB substrate 150 and master chip 110.

When the first slave chip 120 is manufactured in an equivalent manner to the master chip 110, bumps 1912a and 1916a may be present on a first surface 122 of the first slave chip 120 and contact an electrode pad 1910a and a TSV pad 1911a, and a TSV 1914a connected to the TSV pad 1911a protrudes from a second surface 124 of the first slave chip 120. Underfill material 1980 may encase solder bumps 1912a and the connections between TSV 1914 and 1914a (which may include solder 1916a) to assist in reducing defects, such as cracking of the solder bumps. Rather than underfill material, element 1980 may be air, such that an air gap is formed between master chip 110 and slave chip 120.

Isolation layers 1950 and 1960 are formed on the second surface 114 of the master chip 110 and the second surface 124 of the first slave chip 120. The isolation layers 1950 and 1960 may be deposited on a backside of a wafer having master chip 110 and slave chip 120 respectively formed therein. Even though the bump 1912a connected to the electrode pad 1910a of the first slave chip 120 contacts the second surface 114 of the master chip 110, the bump 1912a and the second surface 114 are insulated from each other by the isolation layer 1950 of the master chip 110. As such, a bump-to-wafer backside short-circuit 1902 is prevented.

Figure 20:
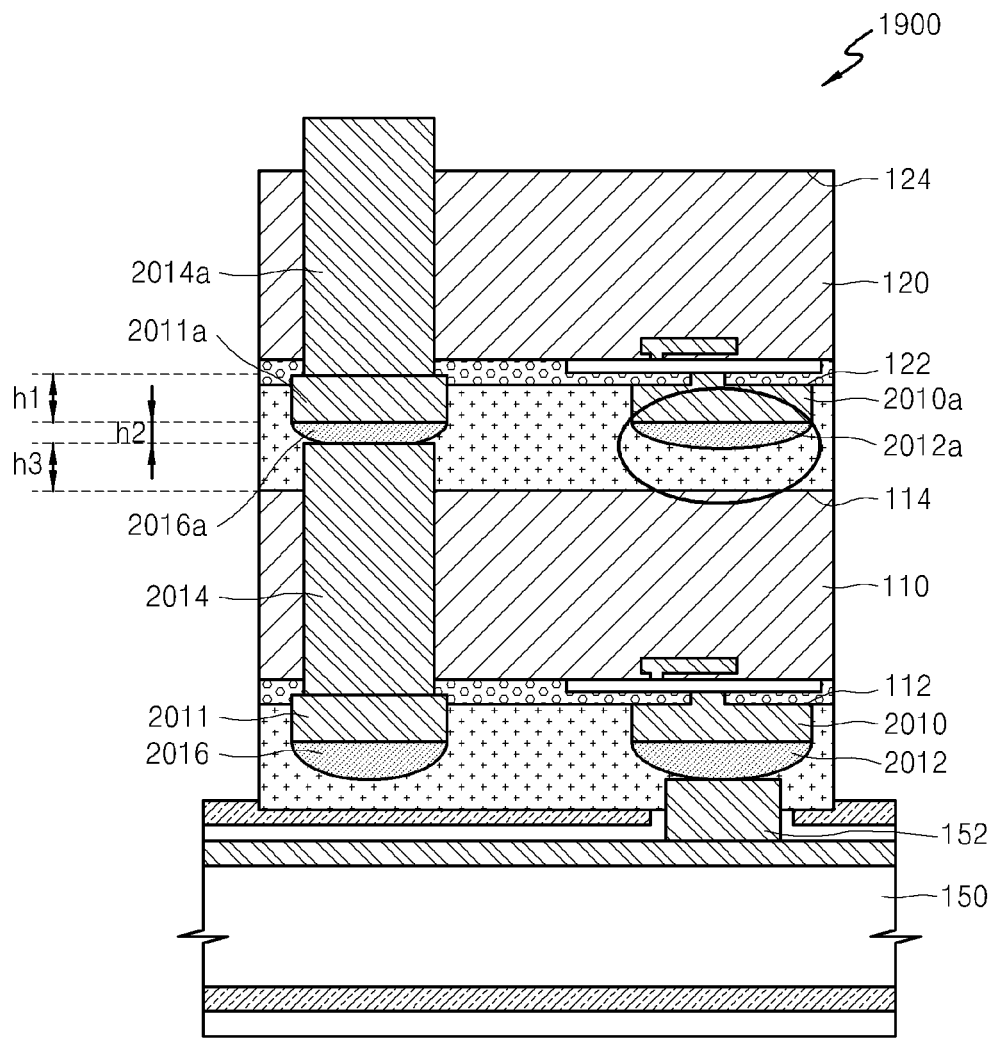
FIG. 20 illustrates a TSV-to-bump air connection method that prevents a bump-to-wafer backside short-circuit, according to an embodiment.

FIG. 20 illustrates a TSV connection (1900 of FIG. 15) and associated method that may reduce the risk of a bump-to-wafer backside short-circuit, according to an embodiment. FIG. 20 may be implemented by the embodiment of FIG. 15 and represent area labeled 1900 in FIG. 15. Referring to FIG. 20, an electrode pad 2010 and a TSV pad 2011 are formed on the first surface 112 of the master chip 110. The electrode pad 2010 and a TSV pad 2011 may be formed during the same process, such by a metal layer deposition, followed by a chemical-mechanical polishing to planarize the metal layer, followed by a patterning of the metal layer. As a result, surfaces of the electrode pad 2010 and TSV pad 2011 (lower surfaces with respect to FIG. 20) may be at the same level and/or coplanar. The electrode pad 2010 is connected to circuit patterns formed over the first surface 112 of the master chip 110, and the TSV pad 2011 is connected to a TSV 2014 formed through the master chip 110. Bumps 2012 and 2016 contact the electrode pad 2010 and the TSV pad 2011, respectively. The TSV 2014 protrudes from the second surface 114 of the master chip 110. The bump 2012 connected to the electrode pad 2010 contacts the electrode 152 of the PCB substrate 150.

When the first slave chip 120 is manufactured in an equivalent manner as the master chip 110, bumps 2012a and 2016a may be present on the first surface 122 of the first slave chip 120 and contact the electrode pad 2010a and the TSV pad 2011a. TSV 2014a connected to the TSV pad 2011a protrudes from the second surface 124.

Heights of the TSV pads 2011 and 2011a of the master chip 110 and the first slave chip 120, thicknesses of the bumps 2016 and 2016a connected to the TSV pads 2011 and 2011a, and protrusion heights of the TSVs 2014 and 2014a are specifically set. The heights of the TSV pads 2011 and 2011a (shown as height h1 with respect to pad 2011a) and the protrusion heights of the TSVs 2014 and 2014a (shown as height h3 with respect to the protrusion of TSV 2014) may be the same and may be, for example, about 10 µm. The height of the bumps 2016 and 2016a prior to connecting master chip 110 and slave chip 120 (although connected, this height is represented as h2 with respect to bump 2016a) are smaller, and more preferably at least 50% smaller, than the protrusion heights of TSVs 2014 and/or 2014a and/or the heights of the TSV pads 2011 and 2011a. The protrusion heights of the TSVs 2014 and 2014a and may be, for example, about 4 µm. The height of the bumps 2012 and 2012a may be the same with respect to each other, and may be the same as the height h2 of bumps 2016 and 2016a. The height of the bumps 2012 and 2012a may be smaller, and more preferably at least 50% smaller, than the protrusion heights of TSVs 2014 and/or 2014a and/or the heights of the TSV pads 2011 and 2011a. The heights of the chip pads 2010 and 2010a may be the same with respect to each other, and may be the same as the heights of pads 2011 and 2011a. The width of the chip pads 2010 and 2010a may the same with respect to each other and may be larger than the widths of pads 2011 and 2011a.

As the master chip 110 and the first slave chip 120 are stacked, the bump 2016a connected to the TSV pad 2011a of the first slave chip 120 contacts the protrusion of the TSV 2014 of the master chip 110. Since the height h2 of the bump 2012a connected to the electrode pad 2010a of the first slave chip 120 is smaller than the protrusion height h3 of the TSV 2014 of the master chip 110, the bump 2012a of the first slave chip 120 does not contact the second surface 114 of the master chip 110. As such, a bump-to-wafer backside short-circuit may be prevented. It should be noted that the height of the bump 2016a may be made smaller than its original height during the connecting process. As shown in FIG. 19, bump 1916a has been squashed during the mounting process. Bump 1916a and bump 1912a may have originally had the same size prior to stacking master chip 110 and slave chip 120, but after mounting, the bump 1916a has been squashed due to compression forces between TSV 1914a and TSV 1914. By providing a bump 2012a having a height h2 less than the height h3 of the protrusion of TSV 2014, even when the height of bump 2016a is lessened to a height less than h2 when master chip 110 and slave chip 120 are connected during the stacking process (e.g., due to squashing and/or compression forces between TSV 2014a and TSV 2014), the height h3 of the protrusion portion of TSV 2014 prevents the gap between master chip 110 and slave chip 120 from lessening to a size where bump 2012a may contact the surface 114 of master chip 110.

Figure 21:
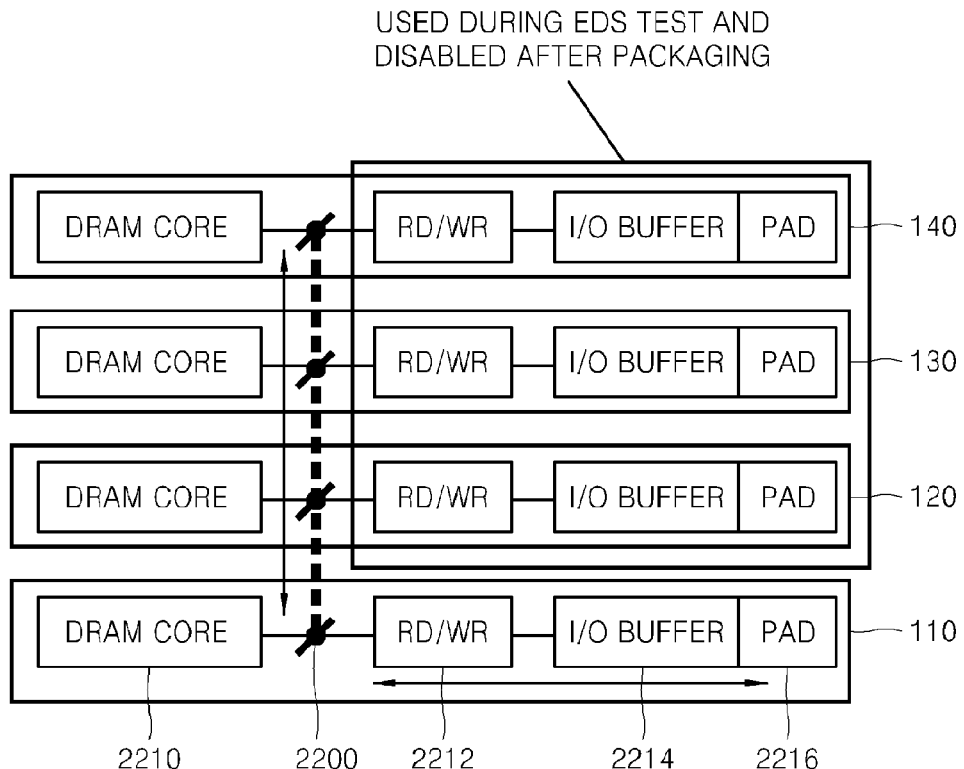
FIG. 21 illustrates circuit blocks that are used in a wafer test and are disabled after a packaging process is performed, in stacked semiconductor chips, according to an embodiment.

FIG. 21 illustrates circuit blocks that are used in a wafer test and may be disabled after a packaging process is performed, e.g., packaging of stacked semiconductor chips, according to an embodiment. As illustrated in FIG. 21, in a 3D device may include identically designed master chip 110 and the first through third slave chips 120, 130, and 140. An chip or die test of the individual chips or dies, such as an EDS test, may be performed. The test may be performed in a particular order of test operations, such as a manufacture dies within a wafer→pre-laser test at wafer level→cell repair at wafer level→post-laser test at wafer level→chip identification fuse cutting at wafer level. A wafer fuse cutting operation is first performed in the cell repair operation. An additional fuse cutting operation at the wafer level is performed in the chip identification fuse cutting operation. Overall test time may be increased due to multiple fuse cutting operations. Even when the cell repair operation and the chip identification fuse cutting operation are performed at the same time, a post-laser test should be performed.

Referring to FIG. 21, the stacked chips 110, 120, 130, and 140 include a DRAM core blocks 2210, a read/write blocks 2212, an input/output buffer blocks 2214, and a pad blocks 2216. When the EDS test is performed, in each of the chips 110, 120, 130, and 140, all of the DRAM core block 2210, the read/write block 2212, and the input/output buffer block 2214 are tested in response to a control signal and data input/output to/from the pad block 2216. Even when each chip has a chip identification signal set as a slave chip, e.g., such as setting chips 120, 130 and 140 as slave chips through a chip identification fuse cutting operation, the EDS test may test in each of the chips 110, 120, 130, and 140, all of the DRAM core blocks 2210, the read/write blocks 2212, and the input/output buffer blocks 2214. This EDS test may be performed when chips 110, 120, 130 and 140 are part of a wafer (which may be the same wafer, or may be different wafers).

The package test may be performed on the stack of master chip 110 and slave chips 120, 130 and 140 having a TSV connection 2200. The master chip 110 is set as the master chip due to its chip identification signal CID, and all of the DRAM core block 2210, the read/write block 2212, the input/output buffer block 2214, and the pad block 2216 of the master chip 110 are tested during the package test. First through third slave chips 120, 130, and 140 are set as slave chips due to their respective chip identification signals CID (which may be set during the chip identification signal CID fuse cutting operation for these chips). The first through third slave chips 120, 130, and 140 may disable the pad blocks 2216 so as to reduce power consumption. In particular, the read/write blocks 2212, the input/output buffer blocks 2214, and the pad blocks 2216 of the first through third slave chips 120, 130, and 140 are used in the EDS test but are disabled in the package test. Each DRAM core block 2210 of the first through third slave chips 120, 130, and 140 is connected to the master chip 110 via the TSV connection 2200 and is tested using the read/write block 2212, the input/output buffer block 2214, and the pad block 2216 of the master chip 110.

Figure 22:
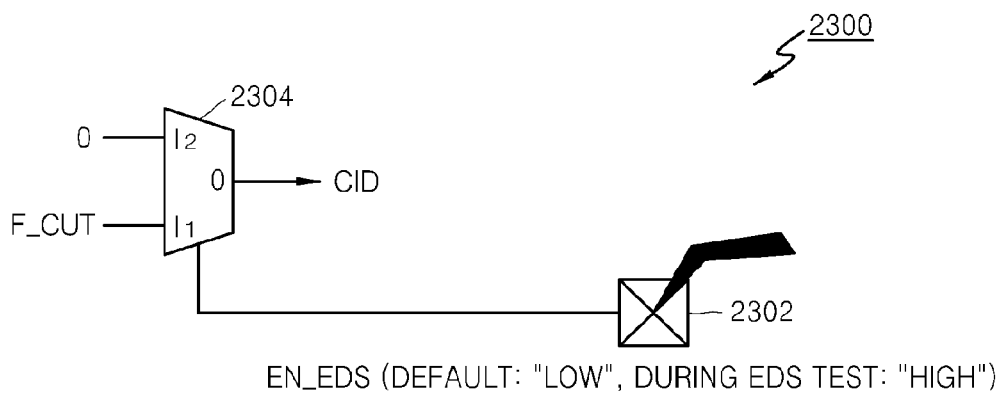
FIG. 22 illustrates a logic circuit in which a wafer can be tested by using a probe pad after a chip identification fuse is cut, according to an embodiment.

FIG. 22 illustrates a circuit block 2300 in which a wafer can be tested by using a probe pad after a chip identification fuse is cut, according to an embodiment. Referring to FIG. 22, the circuit block 2300 includes a probe pad 2302 and a MUX circuit 2304. The circuit block 2300 is included in all of the chips 110, 120, 130, and 140 illustrated in FIG. 21. The MUX circuit 2304 outputs a fuse cutting signal F_Cut received from a first input I1 or a logic "0" signal of a second input I2 as an output signal O in response to an EDS enable signal EN_EDS applied to the probe pad 2302. The output signal O of the MUX circuit 2304 is generated as a chip identification signal CID. This chip identification signal CID output by the MUX circuit 2304 may be the CID signals illustrated and described with respect to FIGS. 12, 13, 14, 15B, 16, and/or 17, and/or the code signals C[0] and C[1] constituting the chip identification signal with respect to the embodiment of FIG. 18. The fuse cutting signal F_Cut may be a result of fuses cut by the chip identification fuse cut work performed during the cell repair operation of each of the chips 110, 120, 130, and 140. For example, in a chip set as the master chip 110, the fuse cutting signal F_Cut is generated as "0", and in a chip set as the first slave chip 120, the fuse cutting signal F_Cut is set as "1". Alternatively, the F_Cut is generated as "0,0", and in a chips set as the first, second and third slave chips 120, 130, 140, the fuse cutting signal F_Cut may be set as "1,0", "0,1" and "1,1". _The EDS enable signal EN_EDS is applied as logic "0" as a default and is applied as logic "1" during the EDS test.

When the EDS enable signal EN_EDS of the corresponding chips 110, 120, 130, and 140 are provided as default logic "0", the MUX circuit 2304 outputs the fuse cutting signal F_Cut received from the first input I1 as the chip identification signal CID. Thus, master chip operates as a master chip, reacting to a master chip CID code, and the slave chips operate as slave chips, reacting to a slave chip CID code. For example, when the chip set as the master chip 110 has an F_Cut signal of "0", the chip identification signal CID of "0" is output by MUX circuit 2304, and when the chip set as the first slave chip 120 has and F_Cut signal of "1", the chip identification signal CID of "1" is output by MUX circuit 2304.

When the EDS test is performed, the MUX circuit 2304 outputs a signal "0" of the second input I2 as the output signal O in response to the EDS enable signal EN_EDS of logic "1". Thus, even when, in the corresponding chip, the chip identification fuse is cut to set the chip as a slave chip, the chip identification signal CID of the corresponding chip is recognized as logic "0" (temporarily setting the chip to act as a master chip), and in the corresponding chip, all of the DRAM core block 2210, the read/write block 2212, the input/output buffer block 2214, and the pad block 2216 are tested since the corresponding chip appears to be the master chip 110. In an alternative embodiment, the input I2 to to MUX circuit 2304 may be a logic "1" or otherwise a code corresponding to a chip identification signal CID which identifies the chip as a slave chip. The MUX circuit 2304 thus outputs a second input I2 as an output signal O in response to an EDS enable signal EN_EDS applied to the probe pad 2302, in response to which the chip would configure itself as a slave chip.

While the inventive concept has been particularly shown and described with reference to exemplary embodiments thereof, it will be understood that various changes in form and details may be made therein without departing from the spirit and scope of the following claims. For example, while many of the above concepts have been explained with respect to a three-dimensional semiconductor device, and with respect to memory semiconductor chips, the invention should not be considered limited to either of these features if the claims do not also include such limitations.

What is claimed is:

1. A semiconductor integrated circuit, comprising:
   a chip pad;
   a memory cell array;
   a decoder configured to select a cell of the memory cell array; and
   a first information path extending between the chip pad and at least one of the memory cell array and the decoder;
   a through substrate via extending from a chip terminal other than the chip pad to a node of the first information path to form a second information path comprising a portion of the first information path and the through substrate via;
   a chip identification programmable circuit having a chip identification output identifying the semiconductor integrated circuit as a master chip or a slave chip;
   a selection circuit responsive to the chip identification output identifying the integrated circuit as a master chip to select the first information path, including the chip pad, as a communication path for an external communication with respect to the integrated circuit, and responsive to the chip identification output identifying the integrated circuit as a slave chip to select the second information path, including the through substrate via, as a communication path for the external communication with respect to the integrated circuit.

2. The semiconductor integrated circuit of 1, wherein the selection circuit is configured to select only one of the first information path and the second information path at any one time.

3. The semiconductor integrated circuit of 1, wherein the chip pad is a data pad and the first information path is a data input path extending from the chip pad to the memory cell array.

4. The semiconductor integrated circuit of 1, wherein the chip pad is a data pad and the first information path is a data output path extending from the memory cell array to the data pad.

5. The semiconductor integrated circuit of 1, wherein the chip pad is a command pad, and the first information path is a command path extending from the command pad to the decoder.

6. The semiconductor integrated circuit of 1, wherein the chip pad is an address pad, and the first information path is an address path extending from the address pad to the decoder.

7. The semiconductor integrated circuit of 1, wherein the selection circuit comprises a multiplexer, an information input and a first information output of the multiplexer being part of the first information path, the information input and a second information output of the multiplexer being part of the second information path and a control input of the multiplexer responsive to the chip identification output to connect the information input to one of the first information output and second information output.

8. The semiconductor integrated circuit of claim 7, wherein the through substrate via is directly connected to a node comprising the second information output of the multiplexer.

9. The semiconductor integrated circuit of claim 1, wherein the selection circuit comprises a tri-state driver, having an input, an output and a high-impedance control input, wherein the input and output of the tri-state driver comprise part of the first information path, and the control input is responsive to the chip identification output to put the output of the tri-state driver in a high impedance state when the chip identification output identifies the integrated circuit as a slave chip.

10. The semiconductor integrated circuit of 1, wherein the chip identification programmable circuit comprises one or more fuses.

11. The semiconductor integrated circuit of 1, wherein the chip identification programmable circuit comprises a mode register set which may be programmed by an external command.

12. A semiconductor package comprising:
   at least a first chip stacked with a second chip, the first and second chip having identical circuit designs, each of the first and second chips comprising:
   a chip pad;
   a memory cell array;
   a decoder configured to select a cell of the memory array; and
   a first information path extending between the chip pad and at least one of the memory cell array and the decoder;

a through substrate via extending from a chip terminal other than the chip pad to a node of the first information path to form a second information path comprising a portion of the information path and the through substrate via; and a chip identification programmable circuit having a chip identification output to identify the chip as a master chip or a slave chip;

wherein the through substrate via of the first chip is connected to the through substrate via of the second chip to comprise a through substrate via connection of the semiconductor package, wherein the chip identification programmable circuit of the first chip identifies the first chip as a master chip, wherein the chip identification programmable circuit of the second chip identifies the second chip as a slave chip, wherein the slave chip is responsive to the master chip due to signals received by the through substrate via connection.

13. The package of claim 12, wherein the chip identification programmable circuit of each of the first and second chips comprises a fuse set.

14. The package of claim 12, wherein the chip identification programmable circuit of each of the first and second chips comprises a mode register set.

15. The package of claim 12,
wherein each of the first and second chips comprise:
a plurality of data chip pads;
a plurality of data input buffers;
and a plurality of data latches,
wherein each data chip pad connected to a respective data input buffer, each data input buffer being connected to a respective data latch at a first portion of a data input path,
wherein the package further comprises a plurality of first through substrate via connections, each first through substrate via connections comprising a through substrate via of the first chip connected to a through substrate via of the second chip, each of the first through substrate via connections connecting to a respective first portion of the data input path of the first chip and a corresponding first portion of the data input path of the second chip.

16. The package of claim 12,
wherein each of the first and second chips comprises:
a plurality of data chip pads;
a plurality of data input buffers;
a plurality of data latches;
a data strobe pad;
and a data strobe buffer having an input connected to the data strobe pad and an output connected to control inputs of the plurality of data latches,
wherein each data chip pad is connected to a respective data input buffer, each data input buffer being connected to a respective data latch, and
wherein the through substrate via connection of the package connects the output of the data strobe buffer of the first chip and the output of the data strobe buffer of the second chip.

17. The package of claim 12,
wherein each of the first and second chips comprises:
a clock pad;
a clock buffer having an input connected to the clock pad; and
an internal clock generator, having an input connected to an output of the clock buffer, wherein the through substrate via connection of the package connects the output of the clock buffer of the first chip and the output of the clock buffer of the second chip.

18. The package of claim 12,
wherein each of the first and second chips comprises:
a plurality of address chip pads;
a plurality of address input buffers;
a plurality of address latches;
a clock pad;
a clock buffer having an input connected to the clock pad and an output connected to control inputs of the plurality of address latches,
wherein each address chip pad is connected to a respective address input buffer, each address input buffer being connected to a respective address latch at a first portion of an address path, and
wherein the package further comprises a plurality of first through substrate via connections, each first through substrate via connections comprising a through substrate via of the first chip connected to a through substrate via of the second chip, each of the first through substrate via connections connecting to a respective first portion of the address path of the first chip and a corresponding first portion of the address path of the second chip.

19. The package of claim 12,
wherein each of the first and second chips comprises:
a command pad;
a buffer having an input connected to the command pad; and
a command decoder, having an input connected to an output of the buffer,
wherein the through substrate via connection of the package connects the output of the buffer of the first chip and the output of the buffer of the second chip.

20. The package of claim 12,
wherein each of the first and second chips comprises:
a plurality of data latches connected to latch data output by the memory cell array;
wherein the package further comprises a plurality of first through substrate via connections, each first through substrate vias connection comprising a through substrate via of the first chip connected to a through substrate via of the second chip, each of the first through substrate via connections connecting to a data node of a respective data latch of the first chip and a corresponding data node of a respective data latch of the second chip.

21. The package of claim 12, wherein each of the first and second chips comprise:
a demultiplexer having an input connected to receive data from the memory cell array, having a first output connected to a first signal line, having a second output connected to a second signal line, and a control input connected to receive a signal responsive to the chip identification output, the multiplexer configured to select the first output when the chip is identified as a master chip by the chip identification output and configured to select the second output when the chip is identified as a slave chip by the chip identification output; and
a multiplexer having a first input connected to the first signal line, a second input connected to a second signal line and an output connected to a data latch;
wherein the through substrate via connection connects the second signal lines of the first chip and the second chip.

* * * * *